United States Patent
Yang et al.

(10) Patent No.: US 6,551,941 B2
(45) Date of Patent: Apr. 22, 2003

(54) METHOD OF FORMING A NOTCHED SILICON-CONTAINING GATE STRUCTURE

(75) Inventors: Chan-syun David Yang, Beverly Hills; Meihua Shen, Fremont; Oranna Yauw, Sunnyvale; Jeffrey D. Chinn, Foster City, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/791,446

(22) Filed: Feb. 22, 2001

(65) Prior Publication Data

US 2002/0151183 A1 Oct. 17, 2002

(51) Int. Cl.$^7$ .............................................. H01L 21/00
(52) U.S. Cl. .......................... 438/714; 216/67; 216/79; 438/719; 438/723; 438/734; 438/739; 438/743
(58) Field of Search ................................. 438/714, 719, 438/723, 734, 739, 743; 216/67, 79

(56) References Cited

U.S. PATENT DOCUMENTS

| | | | |
|---|---|---|---|
| 4,577,392 A | 3/1986 | Peterson | 29/571 |
| 5,808,340 A | 9/1998 | Wollesen et al. | 257/330 |
| 5,844,836 A | 12/1998 | Kepler et al. | 365/156 |
| 5,960,271 A | 9/1999 | Wollesen et al. | 438/197 |
| 6,008,132 A * | 12/1999 | Tabara | 437/734 X |
| 6,044,007 A | 3/2000 | Capodieci | 365/120 |
| 6,107,667 A | 8/2000 | An et al. | 257/408 |
| 6,136,674 A | 10/2000 | An et al. | 438/585 |
| 6,159,781 A | 12/2000 | Pan et al. | 438/167 |
| 6,333,273 B1 * | 12/2001 | Kumihashi et al. | 438/734 X |

OTHER PUBLICATIONS

T. Ghani et al., "100 nm Gate Length High Performance / Low Power CMOS Transistor Structure", IEEE Document No. 0–7803–5413–3/99, IEEE 1999.

* cited by examiner

Primary Examiner—William A. Powell
(74) Attorney, Agent, or Firm—Shirley L. Church; Kathi Bean; Joseph Bach

(57) ABSTRACT

A method of forming a notch silicon-containing gate structure is disclosed. This method is particularly useful in forming a T-shaped silicon-containing gate structure. A silicon-containing gate layer is etched to a first desired depth using a plasma generated from a first source gas. During the etch, etch byproducts deposit on upper sidewalls of the silicon-containing gate layer which are exposed during etching, forming a first passivation layer which protects the upper silicon-containing gate layer sidewalls from etching during subsequent processing steps. A relatively high substrate bias power is used during this first etch step to ensure that the passivation layer adheres properly to the upper silicon-containing gate sidewalls. The remaining portion of the silicon-containing gate layer is etched at a lower bias power using a plasma generated from a second source gas which selectively etches the silicon-containing gate layer relative to the underlying gate dielectric layer, whereby a lower sidewall of the silicon-containing gate layer is formed and an upper surface of the gate dielectric layer is exposed. The etch stack is then exposed to a plasma generated from a third source gas which includes nitrogen, whereby a second, nitrogen-containing passivation layer is formed on the exposed sidewalls of the silicon-containing gate layer. Subsequently, a notch is etched in the lower sidewall of the silicon-containing gate layer. The method of the invention provides control over both the height and the width of the notch, while providing a marked improvement in notch critical dimension uniformity between isolated and dense feature areas of the substrate.

88 Claims, 13 Drawing Sheets

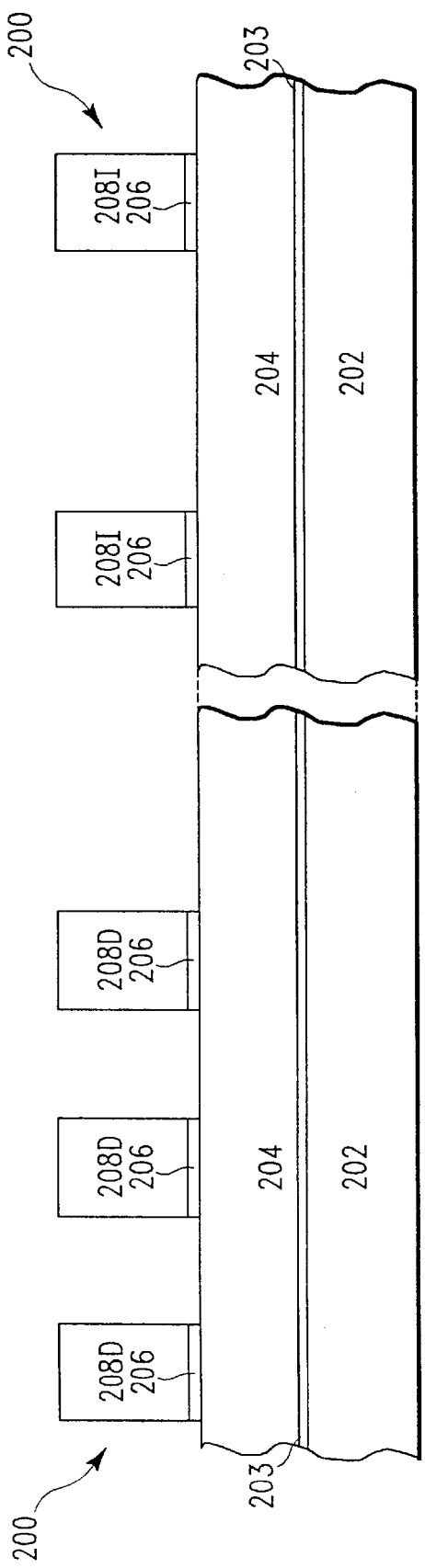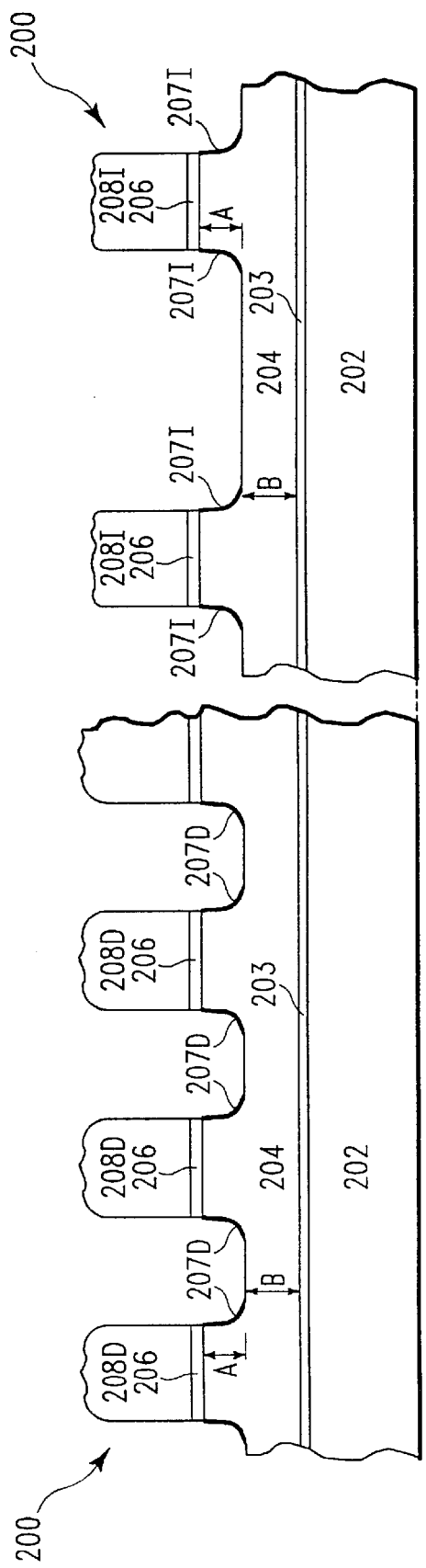
FIG. 2A (Prior Art)
FIG. 2B

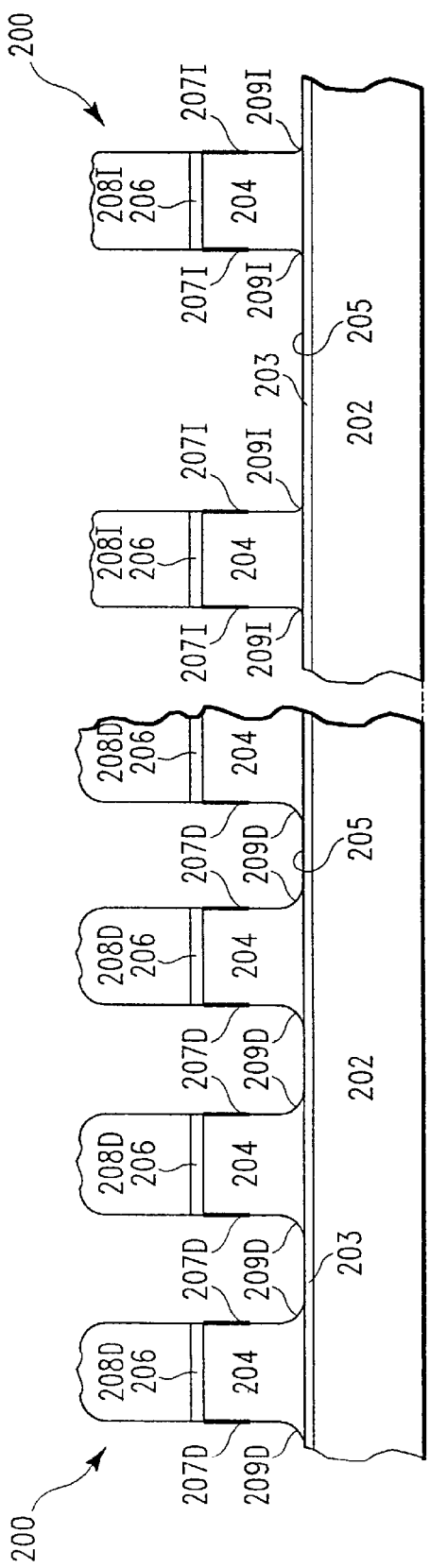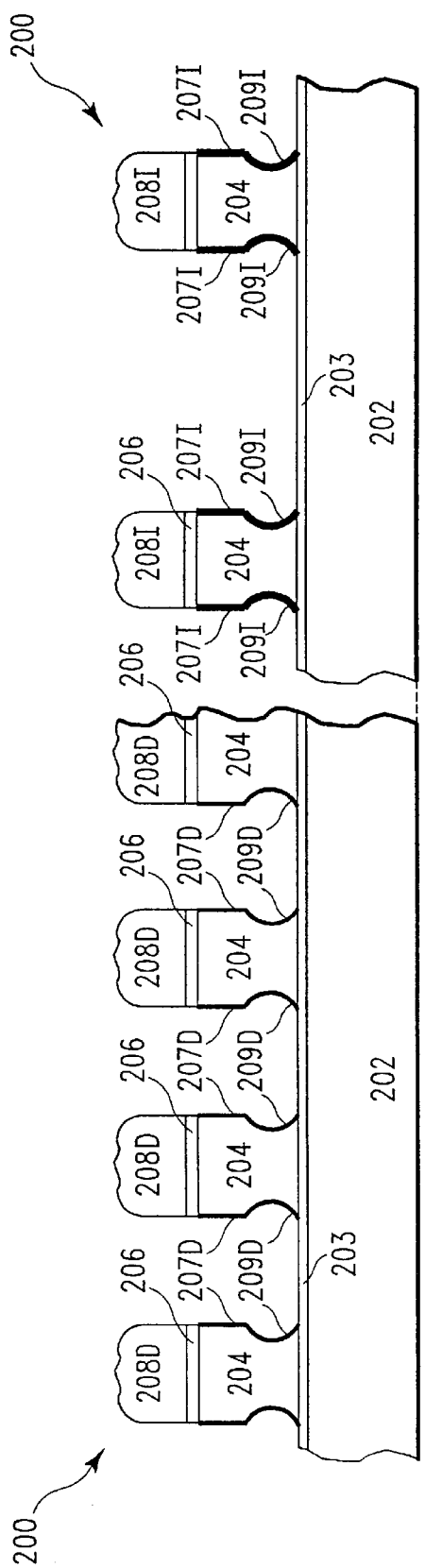
FIG. 2C
FIG. 2D

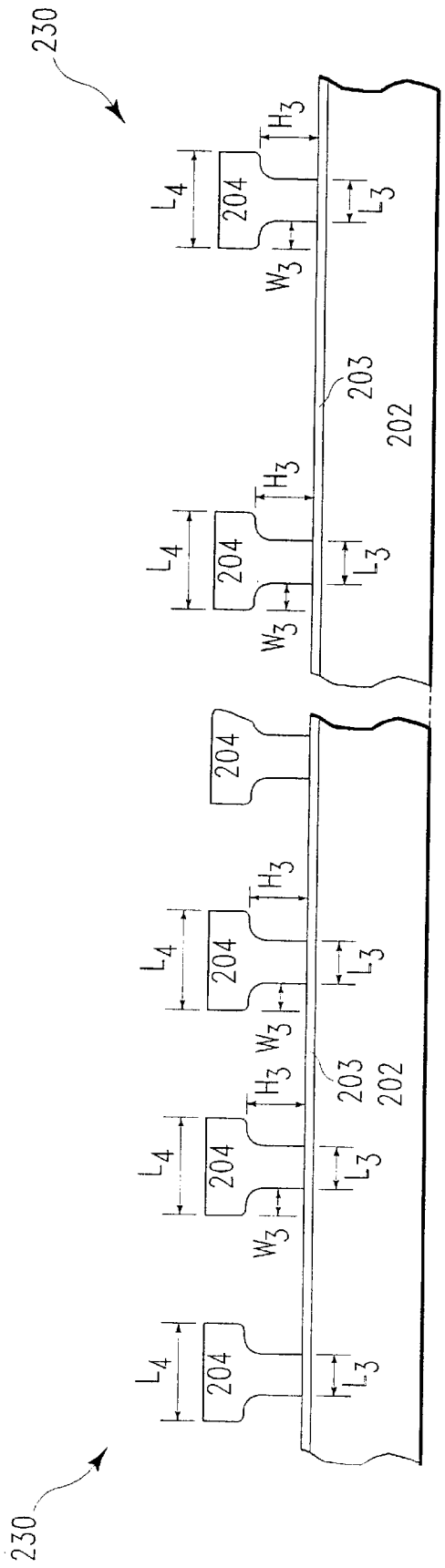

METHOD OF FORMING A NOTCHED SILICON-CONTAINING GATE STRUCTURE

BACKGROUND OF THE INVENTION

1. Field of the Invention

The present invention pertains to a method of forming a notched silicon-containing gate structure. In particular, the present invention provides a multiple step method of forming a notched silicon-containing gate structure which provides good control over notch dimensions and excellent notch dimension uniformity across the surface of a substrate.

2. Brief Description of the Background Art

Integrated circuit (IC) technology has advanced from large scale integration (LSI) to very large scale integration (VLSI). Over the next several years, IC technology is projected to grow to ultra-large scale integration (ULSI). The advancement in monolithic circuit integration has been made possible by improvements in semiconductor manufacturing equipment, as well as in the materials and methods used in processing semiconductor wafers into IC chips.

As integrated circuit technology advances, the requirements of the basic integrated circuit fabrication steps of masking, film formation, doping, and etching are becoming increasingly more stringent. Important factors affecting IC fabrication are the use of greater device densities and smaller minimum feature sizes with smaller separations. Other factors include the use of composite conductive layers, such as silicides, and the increasing importance of the third wafer dimension, where dimensions and shapes must be maintained on vertical surfaces, such as in notches for polysilicon gates. These requirements must be met for a wide range of feature sizes and densities, with no sacrifice of precision.

Polysilicon gates with a substantially square cross-section are often used to form the control electrode for a device. This shape minimizes the resistance of the gate as a function of gate spacing. The resistance of a polysilicon gate, combined with the capacitance of the gate, forms a low-pass filter, which inhibits the speed of the device.

Gate width is a very important factor in integrated circuit manufacture, since it defines the length of the integrated circuit device. Since the ability to accurately define small geometries with existing lithography is limited, the polysilicon gate must often be made wider than desired. The gate can be etched for an additional period of time, but the result has often been a compromise involving limits imposed by photolithographic capability, resistance, and polysilicon gate width.

As discussed above, the ability to etch narrow, high aspect ratio polysilicon gates is important in the formation of integrated circuits. Various methods of forming polysilicon gate structures are provided, for example, in U.S. Pat. No. 4,577,392, to Peterson; U.S. Pat. No. 5,808,340, to Wolleson et al.; U.S. Pat. No. 5,844,836, to Kepler et al.; U.S. Pat. No. 5,960,271, to Wolleson et al.; U.S. Pat. No. 6,004,007, to Capodieci; U.S. Pat. No. 6,107,667, to An et al.; and U.S. Pat. No. 6,136,674, to An et al.

T-shaped polysilicon gate structures, where the top portion of the gate is wider than the bottom portion of the gate, have come into use in recent years. Because a T-shaped gate is wider at the top, it is easier to define, allowing standard photolithography techniques to be used. Further, the wider top of the T-shaped gate structure provides a greater contact area, which allows overlying devices to be more easily aligned to the gate when preparing a multi-layered structure, while the narrower gate length at the bottom of the gate structure provides decreased gate resistance. T-shaped polysilicon gate structures are discussed, for example, by T. Ghani et al. in a publication entitled "100 nm Gate Length High Performance/Low Power CMOS Transistor Structure" (1999 IEEE).

In order to form a T-shaped gate structure, it is necessary to form a notch at the bottom of a polysilicon gate structure which has a substantially square cross-section. The notch is typically formed at the interface of the polysilicon gate and an underlying gate dielectric layer. Prior art processes for forming notched polysilicon gate structures have suffered from inconsistent etch profiles. For example, when conventional processing methods are used, the sides of a polysilicon gate may either slope outward at the bottom, be substantially vertical, or be only minimally notched.

In addition, during etching of notches in a polysilicon gate structure, it is important to be able to maintain good control over both vertical and lateral etching in order to obtain notches having the etch profile and critical dimensions needed for the final device requirements. It is equally important that the notch etching process occurs evenly across the surface of the substrate (typically, a silicon wafer). It would therefore be desirable to provide a method of forming a notch in a polysilicon gate structure which provides good critical dimension control during etching and critical dimension uniformity across the entire substrate.

SUMMARY OF THE INVENTION

We have developed a multiple step method of forming a notched silicon-containing gate structure. The method of the invention provides control over notch dimensions (height vs. width) and excellent etch uniformity across the substrate surface.

The method of the invention for forming a notched silicon-containing gate structure comprises the following steps:

a) providing an etch stack including, from top to bottom, a patterned masking layer, a silicon-containing gate layer, a gate dielectric layer, and an underlying substrate;

b) etching the silicon-containing gate layer to a first desired depth using a plasma generated from a first source gas, to form a first passivation layer on sidewalls of the silicon-containing gate layer which are exposed during etching, whereby upper silicon-containing gate layer sidewalls are protected from etching during subsequent etching steps;

c) etching the remaining portion of the silicon-containing gate layer using a plasma generated from a second source gas which selectively etches the silicon-containing gate layer relative to the gate dielectric layer, to form a lower sidewall of the silicon-containing gate layer and to expose an upper surface of the gate dielectric layer;

d) exposing the etch stack to a plasma generated from a third source gas which includes nitrogen, to form a second, nitrogen-containing passivation layer on the exposed sidewalls of the etched silicon-containing gate layer; and e) etching a notch in the lower sidewall of the silicon-containing gate layer which is not protected by the first passivation layer, using a plasma generated from a fourth source gas which selectively etches the silicon-containing gate layer relative to the gate dielectric layer.

In addition to protecting the upper sidewalls of the silicon-containing gate layer from etching during subsequent processing steps, the first passivation layer substantially defines the height of the notch which is etched in step (e).

We have found that exposing the etched silicon-containing gate layer to a plasma containing nitrogen, prior to etching notches in the lower sidewall of the etched silicon-containing gate layer, results in the preferential deposition of nitrogen-containing passivation layers on sidewalls in isolated areas of the substrate. This counteracts the inherent tendency toward more rapid notch etching in isolated areas of the substrate. The result is that isolated and dense areas of the substrate tend to etch at equal rates, providing excellent etch uniformity and critical dimension uniformity across the surface of the substrate.

Also disclosed herein is a method of controlling a line width at the base of a silicon-containing gate structure. This method comprises the following steps:

a) providing an etch stack including, from top to bottom, a patterned masking layer, a silicon-containing gate layer, a gate dielectric layer, and an underlying substrate;

b) etching the silicon-containing gate layer to a first desired depth using a plasma generated from a first source gas, to form a first passivation layer on sidewalls of the silicon-containing gate layer which are exposed during etching, whereby upper silicon-containing gate layer sidewalls are protected from etching during subsequent etching steps;

c) etching the remaining portion of the silicon-containing gate layer using a plasma generated from a second source gas which selectively etches the silicon-containing gate layer relative to the gate dielectric layer, to form a lower sidewall of the silicon-containing gate layer, including a gate line width at an upper surface of the gate dielectric layer;

d) exposing the etch stack to a plasma generated from a third source gas which includes nitrogen, to form a second, nitrogen-containing passivation layer on exposed sidewalls of the silicon-containing gate layer; and e) etching a notch in the lower sidewall of the silicon-containing gate layer which is not protected by the first passivation layer using a plasma generated from a fourth source gas which selectively etches the silicon-containing gate layer relative to the gate dielectric layer, whereby the final line width of the silicon-containing gate structure is controlled.

Also disclosed herein is a preferred embodiment method of forming a notched silicon-containing gate structure, which comprises the following steps:

a) providing an etch stack including, from top to bottom, a patterned masking layer, a silicon-containing gate layer, a gate dielectric layer, and an underlying substrate;

b) etching the silicon-containing gate layer to a first desired depth using a plasma generated from a first source gas which comprises at least one etchant gas selected from the group consisting of a fluorine-comprising gas, a chlorine-comprising gas, and a bromine-comprising gas, and at least one passivating gas selected from the group consisting of $N_2$, $O_2$, and HBr;

c) etching the remaining portion of the silicon-containing gate layer using a plasma generated from a second source gas which comprises a bromine-comprising gas, a chlorine-comprising gas, and an oxygen-comprising gas, to form a lower sidewall of the silicon-containing gate layer and to expose an upper surface of the gate dielectric layer;

d) exposing the etch stack to a plasma generated from a third source gas which comprises a bromine-comprising gas, a chlorine-comprising gas, $N_2$, and an oxygen-comprising gas; and e) etching a notch in the lower sidewall of the silicon-containing gate layer using a plasma generated from a fourth source gas which comprises a bromine-comprising gas, a chlorine-comprising gas, and an oxygen-comprising gas.

A typical embodiment of the invention provides a gate structure having a T-shaped profile. As used herein, the term "T-shaped gate structure" refers to a gate structure where the top portion of the gate is wider than the bottom portion of the gate. The width of the bottom portion (where the gate structure contacts the underlying gate dielectric layer), which is determined by the width of the notch, is referred to herein as the "gate length" or "line width".

BRIEF DESCRIPTION OF THE DRAWINGS

FIG. 2A shows a polysilicon gate etch stack 200 which represents a starting structure of the kind upon which the method of the present invention is performed. The polysilicon gate etch stack 200 includes, from top to bottom, a patterned layer 208 of photoresist, a patterned dielectric antireflection coating (DARC) layer 206, a polysilicon gate layer 204, and a silicon oxide gate dielectric layer 203, all deposited on a silicon substrate 202. The relative thicknesses of the film stack layers are not shown to scale. The left side of the figure shows dense (D) areas, and the right side of the figure shows isolated (I) areas, of the substrate.

FIG. 2B shows the polysilicon gate etch stack 200 after the performance of a first polysilicon etch step, during which the polysilicon gate layer 204 is etched to a first desired depth A. A first passivation layer is formed on upper polysilicon sidewalls 207 which are exposed during etching.

FIG. 2C shows the polysilicon gate etch stack 200 after the performance of a second polysilicon etch step, during which the remaining thickness of the polysilicon gate layer 204 is etched to form lower sidewalls 209, and an upper surface 205 of the silicon oxide gate dielectric layer 203 is exposed.

FIG. 2D shows the polysilicon gate etch stack 200 after performance of a second passivating step utilizing a plasma source gas which includes nitrogen. A second, nitrogen-containing passivation layer is formed over polysilicon sidewalls 207, 209. Note that the second passivation layers formed on polysilicon sidewalls 207I, 209I in isolated areas of the substrate are thicker than the second passivation layers formed on polysilicon sidewalls 207D, 209D in dense areas of the substrate. Footings remaining at the base of polysilicon gate layer 204 after performance of the second polysilicon etch step are removed during the second passivating step.

FIG. 2E-2 shows the structure 200 after notch etching, when the second passivating step illustrated in FIG. 2D was performed prior to notch etching. Note that lateral notch etching occurs evenly between dense and isolated areas of the substrate. Deposition of a thicker nitrogen-containing passivation layer on polysilicon sidewalls 209I in isolated areas of the substrate during the second passivating step slows down lateral notch etching in isolated areas of the substrate, so that lateral notch etching occurs at roughly the same rate in dense and isolated areas of the substrate.

FIG. 2F shows the finished polysilicon gate structure 230 after removal of the remaining photoresist, DARC layer, and passivation layers. The polysilicon gate structure 230 can be seen to have a T-shaped cross-section, in which the top (L4) of the gate is wider than the bottom (L3).

DETAILED DESCRIPTION OF THE PREFERRED EMBODIMENTS

Figure 1A:
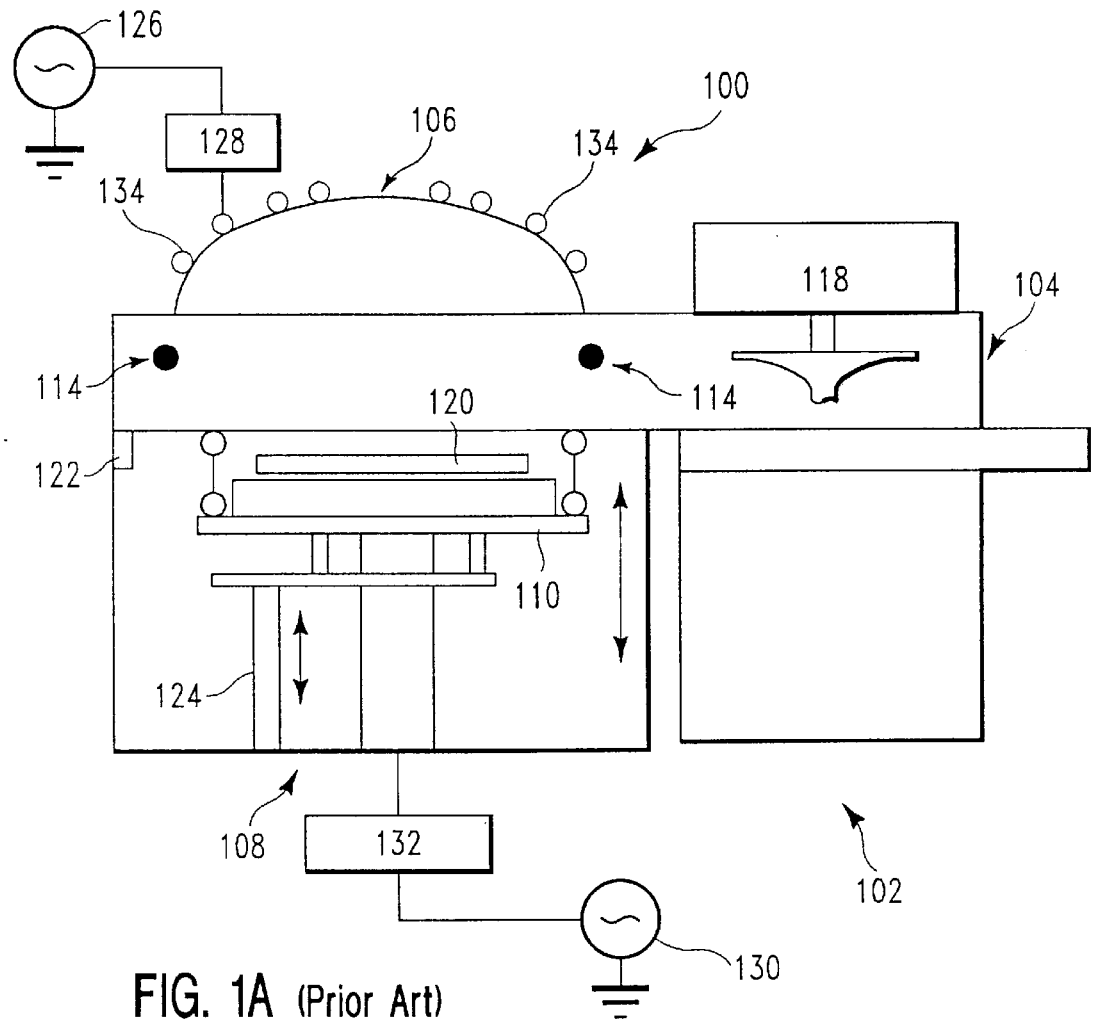
FIG. 1A shows a schematic of an Applied Materials' CENTURA® DPS™ polysilicon etch chamber, which is an example of an apparatus of the kind which can be used to carry out the etching processes described herein.

The present disclosure provides a multiple step method of forming a notched silicon-containing gate structure. In order to perform the method of the invention, one must first provide a starting etch stack, which includes, from top to bottom, a patterned photoresist layer, a patterned dielectric antireflection coating (DARC) layer, a silicon-containing gate layer, and a gate dielectric layer, overlying a substrate.

According to the first step of the method of the invention, the silicon-containing gate layer is pattern etched to a first desired depth. During the etching process, etch byproducts deposit on upper sidewalls of the silicon-containing gate layer which are exposed during etching, forming a first passivation layer which protects the upper silicon-containing gate layer sidewalls from etching during subsequent processing steps. The depth of the first etch, which determines the length of sidewall passivated during the first passivation layer formation, also determines the height of the notch which is subsequently etched beneath the first passivated sidewall.

When the silicon-containing gate layer is polysilicon or amorphous silicon, etching is typically performed using a plasma generated from a source gas which comprises at least one etchant gas selected from the group consisting of a fluorine-comprising gas, a chlorine-comprising gas, and a bromine-comprising gas. The first source gas further comprises at least one passivating gas selected from the group consisting of $N_2$, $O_2$, and HBr. We have found that a source gas comprising about 50 to about 80 volume % $CF_4$, about 10 to about 40 volume % $Cl_2$, and about 10 to about 40 volume % $N_2$ provides a desirable etch rate and a sufficiently thick first passivation layer to permit subsequent control of the notch height. Alternatively, a first source gas comprising about 10 to about 20 volume % $CF_4$, about 40 to about 80 volume %, HBr, about 30 to about 60 volume % $Cl_2$, and about 5 to about 10 volume % $He/O_2$ may be used. Another alternative first plasma source gas comprises about 40 to about 80 volume %, HBr, about 30 to about 70 volume % $Cl_2$, and about 5 to about 10 volume % $He/O_2$. If desired, HBr alone can be used as the first plasma source gas, as it functions as both an etchant gas and a passivating gas.

We have discovered that using a relatively high bias power during the first etch step is very important in helping the passivation layer adhere to the upper sidewalls of the silicon-containing gate layer which are exposed during the first etch step. We have found that applying a substrate bias power which provides a substrate bias voltage of at least about −100 V during the first etch step provides excellent adhesion of the passivation layer to the exposed silicon-containing sidewalls. In the present Examples, where the etching apparatus was a CENTURA® Integrated Processing System provided by Applied Materials, Inc. of Santa Clara, Calif., the substrate bias power was at least about 60 W and was preferably more than 80 W.

In the second step of the method of the invention, the remaining portion of the silicon-containing gate layer is etched, forming a lower sidewall of the silicon-containing gate layer and exposing an upper surface of the gate dielectric layer. During this step, etching is performed using a plasma generated from a source gas which provides excellent (at least 20:1) selectivity for etching the silicon-containing gate layer relative to the gate dielectric layer, to avoid breaking through the thin gate dielectric layer. (The term "selectivity" is typically used to refer to a ratio of etch rates of two materials.) When the silicon-containing gate layer is polysilicon or amorphous silicon and the gate dielectric layer is silicon oxide, we have found that a plasma source gas comprising a bromine-comprising gas, a chlorine-comprising gas, and an oxygen-comprising gas provides excellent selectivity for etching the gate layer relative to the underlying silicon oxide layer. One plasma source gas which provided good results consisted of about 70 to about 90 volume % HBr, about 5 to about 20 volume % $Cl_2$, and about 2 to about 10 volume % $He/O_2$, where $O_2$ comprises about 30 volume % of the $He/O_2$ mixture. The plasma source gas used in the second etching step of the invention typically does not include a passivating gas.

During the second etch step, the bias power is typically reduced to about 80% or less of the bias power used during the first etch step. We have obtained excellent results using a bias power during the second step that is between about 50% to about 75% of the bias power used during the first etch step. A second step bias power within the range of about 40 W to about 50 W works well. The reduced bias power is typically maintained during the performance of the subsequent etching steps.

The third step of the method of the invention is a second, passivating step, in which the etch stack is exposed to a plasma generated from a source gas which includes $N_2$, to provide in the formation of a second, nitrogen-containing passivation layer on exposed sidewalls of the gate layer. Again, to avoid disturbing the thin gate dielectric layer, a plasma source gas which provides excellent selectivity for etching the silicon-containing gate layer relative to the gate dielectric layer is preferably used. When the silicon-containing gate layer is polysilicon or amorphous silicon and the gate dielectric layer is silicon oxide, we have achieved excellent results using a source gas consisting of about 70 to about 90 volume % HBr, about 5 to about 20 volume % $Cl_2$, about 2 to about 10 volume % $N_2$, and about 2 to about 10 volume % $He/O_2$, where $O_2$ comprises about 30 volume % of the $He/O_2$ mixture.

In the final step of the method of the invention, a notch is etched in the lower sidewall of the silicon-containing gate layer which is not protected by the first passivation layer which was generated during the first etch step. Again, it is preferable to use a plasma source gas which provides excellent selectivity for etching the silicon-containing gate layer relative to the gate dielectric layer, to avoid damage to the thin gate dielectric layer during notch etching. For process simplicity and efficiency, the same plasma source gas composition which was used in the silicon-containing gate layer second etch step may also be used in the notch etch step. However, it is contemplated that the plasma source gas composition in this step may be different. The plasma source gas used in the final etching step of the invention typically does not include a passivating gas.

Notched silicon-containing gate structures which are formed in accordance with the method of the present invention typically have a T-shaped profile, so that the gate length and related resistance across the gate are decreased substantially, without requiring more advanced photolithography techniques. The method of the invention typically provides a gate structure where the notch exhibits a height to width ratio ranging from about 1:1 to about 10:1.

As a preface to the detailed description, it should be noted that, as used in this specification and the appended claims, the singular forms "a", "an", and "the" include plural referents, unless the context clearly dictates otherwise.

I. An Apparatus for Practicing the Invention

The embodiment etch processes described herein were carried out in a CENTURA® Integrated Processing System, available from Applied Materials, Inc., of Santa Clara, Calif. The system is shown and described in U.S. Pat. No. 5,186,718, the disclosure of which is hereby incorporated by reference. Although the etch process chamber used in the Examples presented herein is shown in schematic in FIG. 1A, any of the etch processors available in the industry should be able to take advantage of the etch chemistry described herein, with some adjustment to other process parameters. The equipment shown in schematic in FIG. 1 includes a Decoupled Plasma Source (DPS) of the kind described by Yan Ye et al. at the Proceedings of the Eleventh International Symposium of Plasma Processing (May 7, 1996) and published in the *Electrochemical Society Proceedings* (Volume 96-12, pp. 222–233, 1996), which is hereby incorporated by reference. The plasma processing chamber enables the processing of an 8 inch (200 mm) diameter wafer.

FIG. 1A shows a schematic of a side view of an individual CENTURA® DPS™ polysilicon etch chamber 100. The etch chamber 100 consists of an upper chamber 104 having a ceramic dome 106, and a lower chamber 108. The lower chamber 108 includes a monopolar electrostatic chuck (ESC) cathode 110. Gas is introduced into the chamber via gas injection nozzles 114 for uniform gas distribution. Chamber pressure is controlled by a closed-loop pressure control system (not shown) using a throttle valve 118. During processing, a substrate 120 is introduced into the lower chamber 108 through inlet 122. The substrate 120 is held in place by means of a static charge generated on the surface of electrostatic chuck (ESC) cathode 110 by applying a DC voltage to a conductive layer (not shown) located under a dielectric film (not shown) on the chuck surface. The cathode 110 and substrate 120 are then raised by means of a wafer lift 124 and sealed against the upper chamber 104 in position for processing. Etch gases are introduced into the upper chamber 104 via gas injection nozzles 114. The etch chamber 100 uses an inductively coupled plasma source power 126 and matching network 128 operating at 12.56 MHz for generating and sustaining a high density plasma. The wafer is biased with an RF source 130 and matching network 132 operating at 13.56 MHz. Plasma source power 126 and substrate biasing means 130 are controlled by separate controllers (not shown).

Figure 1B:
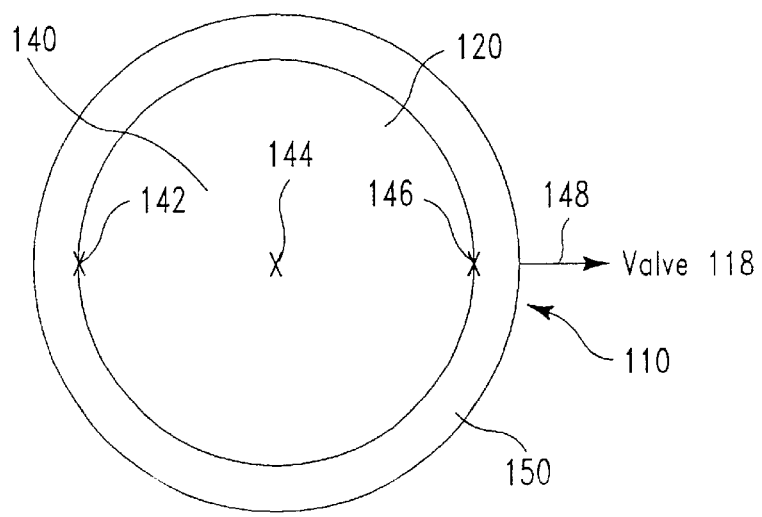
FIG. 1B shows a schematic of a substrate surface, including the top, bottom, and center locations of a substrate relative to the schematic of the processing apparatus shown in FIG. 1A.

FIG. 1B shows a schematic of a substrate 120 surface 140, including the bottom 142, center 144, and top 146 surface locations on substrate 120 (a silicon wafer in this case). These surface locations are shown, relative to the schematic of the processing apparatus 100 shown in FIG. 1B, where arrow 148 indicates the direction toward vacuum throttle valve 118, and substrate 120 is shown resting on upper surface 150 of electrostatic chuck 110.

Figure 9:
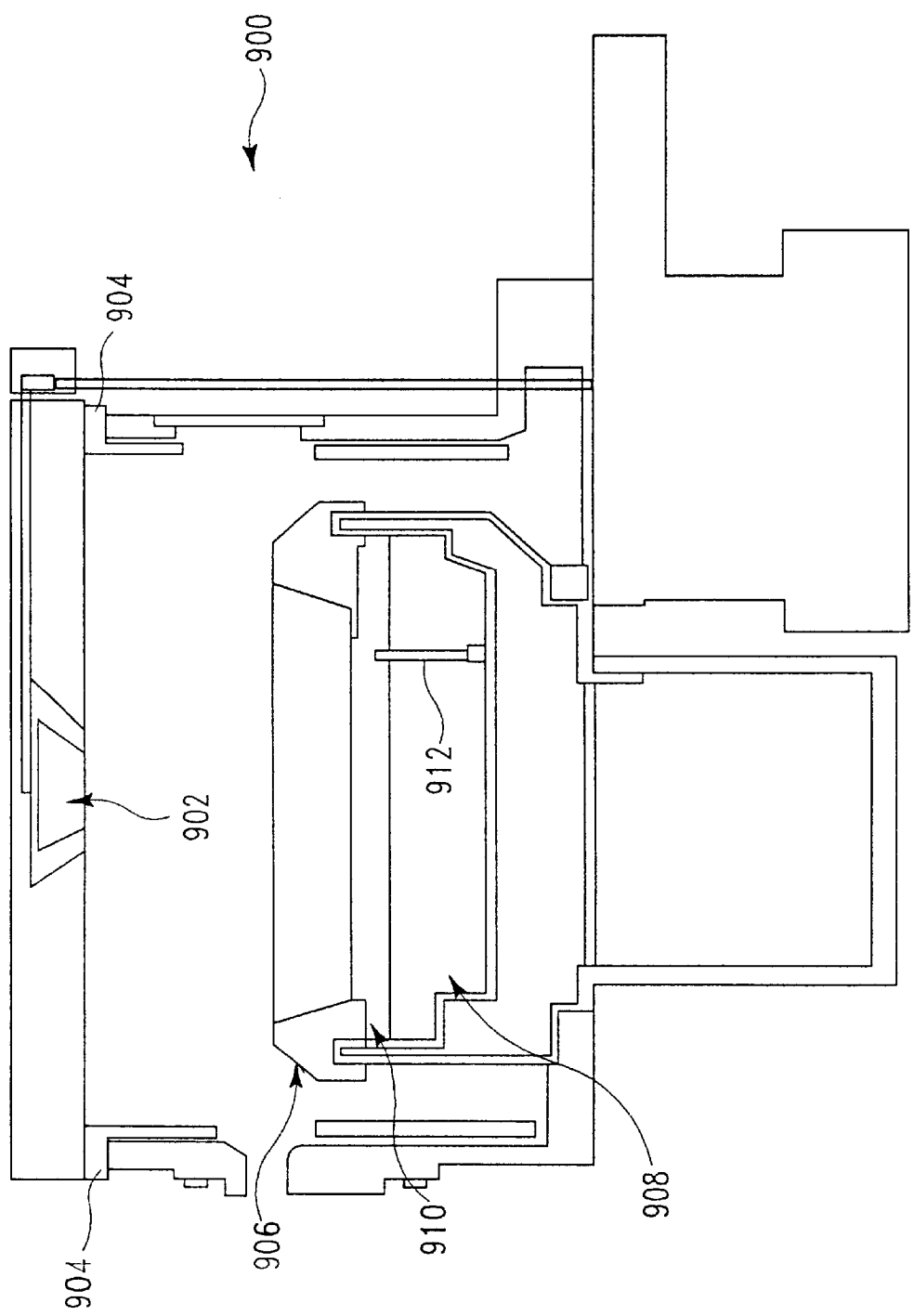
FIG. 9 is a schematic of an Applied Materials' MXP+ polysilicon etch chamber, which is an alternative example of an apparatus of the kind which can be used to carry out the etching processes described herein.

Alternatively, the method of the invention may be performed in an etch processing apparatus wherein power to a plasma generation source and power to a substrate biasing means are controlled by a single power control, such as the Applied Materials' MXP or MXP+ polysilicon etch chamber. FIG. 9 is a schematic of an Applied Materials' MXP+ polysilicon etch chamber 900, which is a parallel plate plasma etch chamber of the kind which is well-known in the art. The MXP+ polysilicon etch chamber offers advantages over other similar etch chambers in that it includes a simplified, two-dimensional gas distribution plate 902, which allows for more uniform gas distribution throughout the chamber. Another modification is a removable aluminum chamber liner 904, which can be easily removed and replaced during each wet cleaning procedure, allowing for a more rapid cleaning cycle. Yet another modification is an improved focus ring 906, which moves together with (rather than independently from) the cathode 908, resulting in reduced particle generation due to fewer moving parts within the apparatus. The high temperature cathode 908 has independent temperature control (not shown), which functions in response to a temperature reading from pedestal temperature probe 912, which permits operation at a temperature in excess of the process chamber temperature. The substrate to be processed (not shown) rests on an electrostatic chuck pedestal 910, which is joined to cathode 908.

II. Method of the Invention for Forming a Notch in a Polysilicon Gate Structure Prior to performing the method of the invention, one must first provide a starting silicon-containing gate etch stack. A typical process for forming such an etch stack is described below.

FIG. 2A shows a silicon-containing gate etch stack 200 which represents a starting structure of the kind upon which the method of the present invention is performed. The pattern is one of lines and spaces, and FIG. 2A illustrates a cross-sectional schematic of these lines and spaces.

Silicon-containing gate etch stack 200 includes the following layers, from top to bottom: a patterned layer 208 of photoresist; a patterned dielectric antireflection coating (DARC) layer 206; a silicon-containing gate layer 204; and a gate dielectric layer 203, all deposited on a substrate 202. The left side of FIG. 2A shows dense (D) areas, where the etched structural elements are closer together, and the right side of the figure shows isolated (I) areas of the substrate, where the etched structural elements are farther apart.

The thickness and patterning method for the photoresist layer 208 will depend on the particular photoresist material used and the pattern to be imaged in the photoresist. Photoresist layer 208 may be any suitable photoresist material known in the art. Typically, the photoresist is an organic, carbon-containing material. A frequently used photoresist is a DUV (Deep UV) photoresist available from either JSR® or SHIPLEY®, INC. A typical film thickness for such a DUV photoresist ranges from about 4000 Å to about 10,000 Å.

The patterned masking layer 206, which forms a protective coating over silicon-containing gate layer 204, is typically a dielectric antireflection coating (DARC) layer. The DARC layer 206 may be formed from any of the dielectric ARC materials known in the art. When the DARC layer 206 is silicon oxynitride ($SiO_xN_y$), the thickness of the DARC layer typically ranges between about 150 Å to about 800 Å. A silicon oxynitride DARC layer 206 may be deposited using conventional methods known in the art, such as plasma-enhanced chemical vapor deposition (PECVD). The use of organic-based DARC layers which are known in the art and commercially available is also contemplated as a part of this disclosure.

The DARC layer is pattern etched using conventional etching techniques known in the art, depending on the particular DARC material used. In the starting etch stack used to prepare the polysilicon gate structure etched in the Examples below, the DARC layer was silicon oxynitride, with a thickness of about 300 Å. The silicon oxynitride DARC layer 206 was pattern etched using the following process conditions: a plasma source gas comprising 75 sccm $CF_4$ and 120 sccm Ar; a plasma source power of 500 W; a substrate bias power of 75 W; a process chamber pressure of 4 mTorr; and a substrate temperature of about 50° C. An etch time of approximately 19 seconds provided a 50% overetch past an end point measurement.

The silicon-containing gate layer 204 is typically polysilicon or amorphous silicon. Although the silicon-containing gate material used in the Examples described below was undoped polysilicon, the use of a doped silicon-containing gate material (such as phosphite-doped N-type polysilicon or boron-doped P-type polysilicon), in order to provide a low resistance gate, is also contemplated as a part of this disclosure.

The silicon-containing gate layer 204 is typically formed to have a thickness within the range of about 1500 Å to about 3000 Å. In the starting etch stack used to prepare the silicon-containing gate structure etched in the Examples below, the silicon-containing gate layer 206 was polysilicon, which had a thickness of about 1700 Å. The polysilicon gate layer 204 was deposited using chemical vapor deposition (CVD) techniques known in the art.

Underlying the polysilicon gate layer 204 is a thin gate dielectric layer 203, which is typically an inorganic oxide, such as silicon oxide, silicon oxynitride, or tantalum pentoxide, for example. Alternatively, the gate dielectric layer may be an organic dielectric, such as Poly(arylene) ethers, PolyI(arylene)ether oxazoles, Parylene-N, Polyimides, Polynaphthalene-N, Polyphenyl-Quinoxalines, Polybenzoxazoles, Polyindane, Polynorborene, Polyphenyleneoxide, and αC, for example.

A silicon oxide gate layer 203 is typically formed to have a thickness within the range of about 15 Å to about 100 Å. In the starting etch stack used to prepare the silicon-containing gate structure etched in the Examples below, the gate dielectric layer 203 was silicon oxide, which had a thickness of about 25 Å. When tantalum pentoxide is used, the thickness of the gate dielectric layer may be lower than when silicon oxide is used. Such gate dielectric layers are typically formed or deposited using conventional methods known in the art, such as thermal oxidation or plasma-enhanced chemical vapor deposition (PECVD).

The substrate 202 is typically silicon, but may alternatively be silicon-on-insulator (SOI) or glass, for example. When the substrate is silicon, the silicon-containing gate layer 204 may be either polysilicon or amorphous silicon. However, when a glass substrate is used, the silicon-containing gate layer 204 must be amorphous silicon, because, in order to form a polysilicon gate layer, an underlying silicon substrate is needed as a seed layer. Amorphous silicon can be deposited using conventional physical vapor deposition (PVD) or chemical vapor deposition (CVD) techniques.

Although the Examples described below pertain to the use of a polysilicon gate layer, the use of amorphous silicon is also contemplated as a part of this disclosure. Etching techniques would be substantially the same for amorphous silicon as those described below for polysilicon.

III. EXAMPLES

Example One: Preparing the Notched Silicon-containing Gate Structure

In a first embodiment of the invention, a first polysilicon etch step was performed to etch polysilicon gate layer 204 to a first desired depth A, as shown in FIG. 2B. The height B (remaining thickness of polysilicon gate layer 204) will become the height of the notch which is subsequently etched beneath depth A. Process conditions used during the first polysilicon etch step were as follows: a plasma source gas comprising 100 sccm $CF_4$, 20 sccm $Cl_2$, and 30 sccm $N_2$; a plasma source power of 600 W; a substrate bias power of 60 W; a process chamber pressure of 4 mTorr; and a substrate temperature of about 50° C. The first polysilicon etch step was performed for approximately 40 seconds. In addition to etching the polysilicon, this source gas provides for the formation of a nitrogen-containing passivation layer on the surface of the etched polysilicon. This passivation layer is created by the build-up of non-volatile etch byproducts on upper polysilicon sidewalls 207 which are exposed during etching.

Referring to FIG. 2B, approximately 1200 Å of the original 1700 Å thickness of the polysilicon gate material 204 was removed during the first polysilicon etch step (i.e., depth A is approximately 1200 Å). After performance of the first polysilicon etch step, a partial layer of unetched polysilicon gate material 204 remained on the substrate 202. In this case, the partial polysilicon layer had a thickness B of approximately 500 Å (Note: Layer thicknesses in figures are not to scale). Since the outer surface of the polysilicon etched to depth A is passivated during etching to form a protective layer, this depth A limits the height of a notch subsequently etched into the remaining polysilicon partial layer. Thus, height B is representative of the notch height.

Referring to FIG. 2C, a second polysilicon etch step was performed to etch the remaining portion of polysilicon gate layer 204. Lower sidewalls 209 of polysilicon gate layer 204 were formed and an upper surface 205 of silicon oxide gate dielectric layer 203 was exposed during this second etching. Process conditions for the second polysilicon etch step were as follows: a plasma source gas comprising 160 sccm HBr, 20 sccm $Cl_2$, and 8 sccm $He/O_2$; a plasma source power of 1000 W; a substrate bias power of 40 W; a process chamber pressure of 50 mTorr; and a substrate temperature of about 50° C. The second polysilicon etch step was performed for 27.4 seconds. Emissivity was checked to provide an end-point indication for the etch step, and the etch cycle was adjusted in accordance with a change in the emissivity, using techniques known in the art.

As shown in FIG. 2C, a substantial amount of the passivation layer that was formed on the upper sidewalls 207 of polysilicon gate layer 204 during the first polysilicon etch step was still in place after the second polysilicon etch step. In fact, the passivation layer on upper polysilicon sidewalls 207 is typically thickened by further deposition of etch byproducts during the second polysilicon etch step. The etch byproducts which form during the second etch step and which increase surface passivation may include, but are not limited to, silicon bromide, silicon oxide, and silicon chloride. These byproducts are added to silicon nitride, silicon chloride, and carbon/nitrogen compound mixtures present from the first polysilicon etch step.

As shown in FIG. 2C, after performance of the second polysilicon etch step, the lower sidewalls 209 of polysilicon gate layer 204, in which notches are to be formed, are exposed, with only a thin layer of passivating material being present. The thick passivation layer formed during the first polysilicon etch step forms a protective collar over the upper sidewalls 207 of polysilicon gate layer 204, which shields the upper portion of polysilicon gate layer 204 from etching. Depending on the eventual desired notch height, the upper sidewall portion 207 which is covered by the passivation layer typically has a height within the range of about 60% to about 85% of the original height of polysilicon gate layer 204.

Referring to FIG. 2D, a second passivating step utilizing a plasma source gas which includes nitrogen was then performed. Process conditions for the second passivating step were as follows: a plasma source gas comprising 160 sccm HBr, 20 sccm $Cl_2$, 8 sccm $He/O_2$, and 10 sccm $N_2$; a plasma source power of 1000 W; a substrate bias power of 40 W; a process chamber pressure of 50 mTorr; and a substrate temperature of 50° C. Etching was performed for approximately 30 seconds.

The purpose of the second passivating step is to build up the passivation layer on polysilicon sidewalls 207I, 209I in isolated areas of the substrate, in order to protect these sidewalls from over-aggressive notch etching during the subsequent notch etch step. Since some etching takes place during the passivating step, footings remaining at the base of the polysilicon gate layer 204 are typically removed at this time. As shown in FIG. 2D, passivation layers formed on polysilicon sidewalls 207I, 209I in isolated areas of the substrate during the passivating step are thicker than passivation layers formed on polysilicon sidewalls 207D, 209D in dense areas of the substrate, since isolated sidewall surfaces are more accessible and etching action is minor.

After the passivating step, a notch etching step was performed to remove polysilicon gate material and form notches in the area of the lower polysilicon sidewalls 209, which have a much thinner passivation layer than the upper polysilicon sidewalls 207. Process conditions for the notch etch step were as follows: a plasma source gas comprising 160 sccm HBr, 20 sccm $Cl_2$, and 8 sccm $He/O_2$; a plasma source power of 1000 W; a substrate bias power of 40 W; a process chamber pressure of 50 mTorr; and a substrate temperature of about 50° C. The notch etch step was performed for approximately 50 seconds.

Figures 1, 2E:
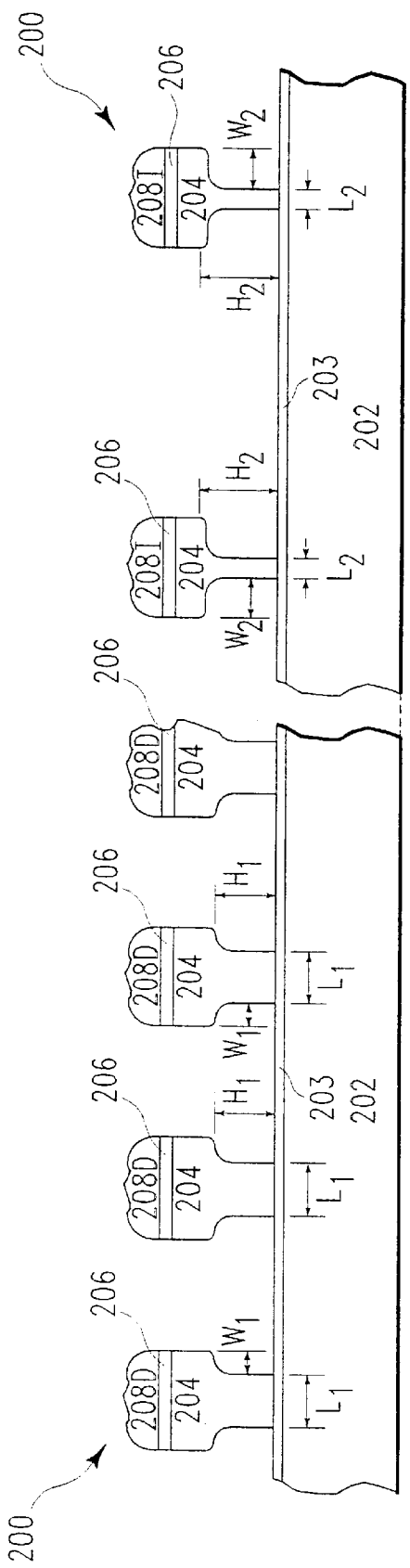
FIG. 2E-1 shows how the structure 200 shown in FIG. 2C would appear after notch etching if the second passivating step illustrated in FIG. 2D were not performed prior to performance of the notch etching step. Note that lateral notch etching occurs unevenly between dense and isolated areas of the substrate. Lateral notch etching proceeds more rapidly in isolated areas of the substrate, resulting in relatively wider notches (W2) and shorter gate lengths (L2).

FIG. 2E-1 illustrates what would happen if the notch etch step were performed directly after performance of the second polysilicon etch step, without the intervening passivating step. Without the thickened passivation layer on lower polysilicon sidewalls 209I in isolated areas of the substrate, lateral notch etching proceeds more rapidly in isolated areas. This results in wider notches (W2) and shorter gate lengths (L2). By contrast, polysilicon gate structures in dense areas of the substrate tend to form narrower notches (W1), with longer gate lengths (L1).

Figures 2, 2E:
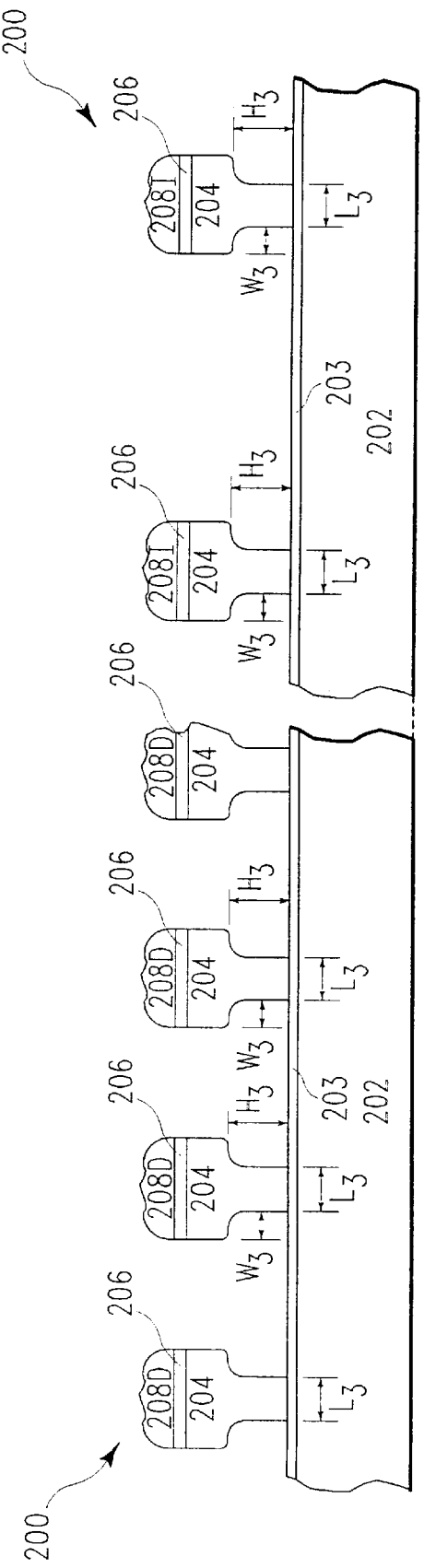

FIG. 2E-2 shows the polysilicon gate structure 200 after notch etching, when the passivating step is performed prior to the notch etching step. Deposition of a thicker nitrogen-containing passivation layer on polysilicon sidewalls 209I in isolated areas of the substrate during the passivating step slows down lateral notch etching in isolated areas of the substrate, because etchant species in the plasma source gas must first work their way through the passivating layer before reaching the underlying polysilicon. This counteracts the inherent tendency toward more rapid etching in isolated areas of the substrate. When the method of the invention is performed, lateral notch etching occurs at roughly the same rate in dense and isolated areas of the substrate. As shown in FIG. 2E, this provides excellent etch uniformity across the surface of the substrate, resulting in very consistent notch widths (W3) and gate lengths (L3) between dense and isolated areas of the substrate.

Typical process condition ranges for each of the steps of the method of the invention are provided in Table One, below.

TABLE ONE

Typical Process Conditions for Forming a Notched Polysilicon Gate Structure

| Process Condition | First Polysilicon Etch | Second Polysilicon Etch | Passivating Step | Notch Etch |
|---|---|---|---|---|
| Total Gas Flow (sccm) | 100–200 | 100–200 | 100–200 | 100–200 |
| $CF_4$ (sccm) | 20–100 | — | — | — |
| HBr (sccm) | 0–200 | 100–200 | 100–200 | 100–200 |
| $Cl_2$ (sccm) | 20–100 | 20–100 | 20–100 | 20–100 |
| $N_2$ (sccm) | 0–40 | — | 5–20 | — |
| $He/O_2$ (sccm)* | 0–20 | 10–30 | 10–30 | 10–30 |
| Plasma Source Power (W) | 200–1000 | 200–1000 | 200–1000 | 200–1000 |
| Substrate Bias Power (W) | 60–150 | 20–60 | 20–60 | 20–60 |
| Process Chamber Pressure (mTorr) | 4–10 | 30–70 | 30–70 | 30–70 |
| Substrate Temp. (° C.) | 20–70 | 20–70 | 20–70 | 20–70 |
| Etch Time (sec) | 20–60 | Endpoint | 20–40 | 40–80 |
| Plasma Density ($e^-/cm^3$) | $1 \times 10^{12}$ | $1 \times 10^{11}$ | $1 \times 10^{11}$ | $1 \times 10^{11}$ |

*$O_2$ is 30 volume % of the $He/O_2$ mixture.

The method of the invention provides excellent control over both the height and the width of the notch. As described above, the height of the notch can be controlled by adjusting the etch time for the first polysilicon etch step, which determines the length of sidewall protected by the passivation layer generated on upper sidewalls 207 of polysilicon gate layer 204. The width of the notch can be controlled by adjusting the amount of passivation produced during the second passivation step on the sidewall surface to be notched, and the etch time for the notch etch step, or a combination of both. For a given sidewall passivation layer thickness, if a narrower notch (ie., longer gate length) is desired, the etch time for the notch etch step should be decreased; if a wider notch (i.e., shorter gate length) is desired, the etch time for the notch etch step should be increased. The etch times for each step of the method of the invention can easily be optimized to provide a notch having a particular height and width, depending on the composition and thickness of each layer in the starting etch stack.

After performance of the notch etch step, the remaining photoresist 208 and passivation layers were removed. Passivation layers were removed by dipping the substrate in a 1 volume % HF (in water) solution for about 20 seconds. Following the HF dip, the substrate was soaked in an $H_2SO_4/H_2O_2$ solution (which is typically at least 80 volume % $H_2SO_4$) for approximately 20 minutes to remove the remaining photoresist.

FIG. 2F illustrates the finished polysilicon gate structure 230. The polysilicon gate structure can be seen to have a T-shaped cross-section. Because the top portion of the gate (L4) is wider, it provides a greater contact area, which allows overlying devices to be more easily aligned to the gate when preparing a multi-layered structure. Further, because the gate is wider at the top, it is easier to define for a given device length, allowing standard photolithography techniques to be used. The narrow gate length (L3) at the bottom of the polysilicon gate structure, which is defined by the notch width, provides decreased gate resistance.

The polysilicon gate structure 230 is now complete, and subsequent processing steps can be performed using techniques known in the art. Subsequent processing steps typically include deposition of a dielectric material to fill the etched area, followed by planarization. The DARC layer 206 may be removed in a subsequent gate dielectric 203 removal step, or may be left in place and incorporated as part of the device.

During development of the method of the invention, we investigated the effects on various structural parameters of the finished polysilicon gate structure caused by varying different process conditions during the second polysilicon etch step, the passivating step, and the notch etch step.

Example Two: The Effect of Process Variable Changes

The following is a list of definitions of terms that are used below, with reference to FIGS. 3–8:

Referring to FIG. 1B, the term "top" refers to the location 146 on a substrate 120 that is the closest to the vacuum throttle valve 118. The term "center" refers to the center 144 of a substrate 120.

The term "feature", as used herein, typically refers to the etched silicon-containing gate structure. The term "isolated" (or "iso") refers to an isolated feature on a substrate. The term "dense" (or "den") refers to a dense array of features. For example, the term "Top-Iso" refers to an isolated feature at the top of a substrate; the term "Ctr-Den" refers to a dense array of features at the center of a substrate. A measurement for a dense array of features is typically taken at a feature located at the center of a dense array of features.

As used herein, the term "critical dimension" refers to, but is not limited to, the length of the etched silicon-containing gate at the surface of the dielectric layer. The term "CD Bias (Dense-Iso)" refers to the difference (Δ) between a critical dimension measurement of a feature located at the center of a dense arrays of features and a critical dimension measurement of an isolated feature, at a given geographical location on a substrate. The term "CD uniformity" refers to the difference (Δ) between a critical dimension measurement taken at a first geographical location on a substrate and a critical dimension measurement taken at a second geographical location on the substrate. The term "CD Bias (Center-Edge)" refers to the difference (Δ) between a critical dimension measurement taken at the center of a substrate and a critical dimension measurement taken at the edge of a substrate, and is an indication of the CD uniformity across the substrate. Ideally, the CD Bias (Dense-Iso) should be as close to zero as possible, and the CD Bias (Center-Edge) should also be as close to zero as possible, to have uniformity across the substrate.

The term "wide" (or "wid"), as used herein, refers to a feature having a target gate length (i.e., critical dimension) of 0.35 μm. Unless otherwise noted, all other features discussed herein had a target gate length of 0.15 μm.

Figure 3A:
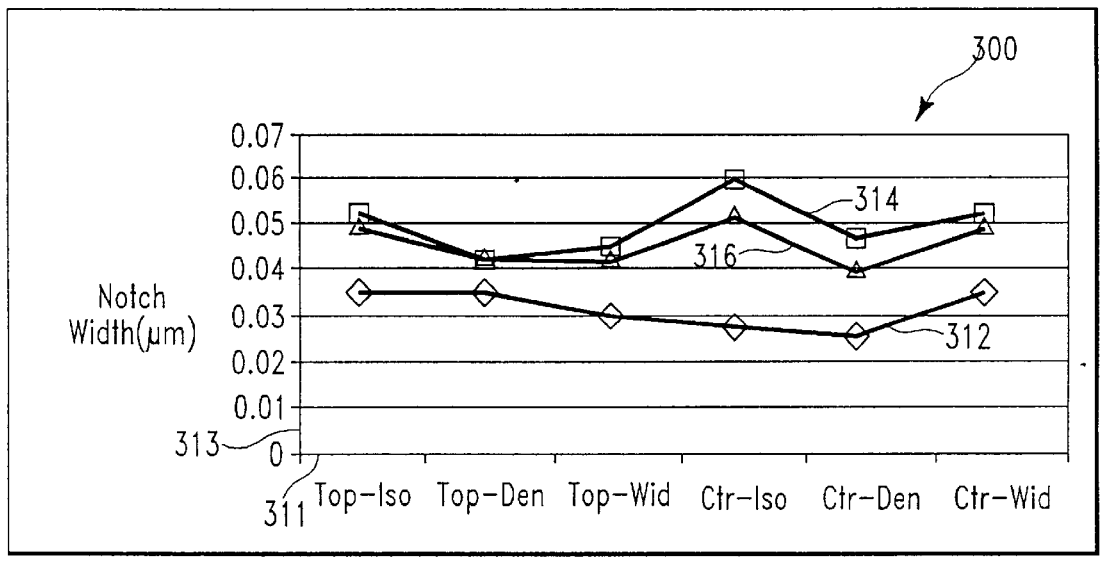
FIG. 3A shows the effect of varying the $Cl_2$ content of the plasma source gas used during the second polysilicon etch step, the second passivating step, and the notch etch step on the notch width.
Figure 3B:
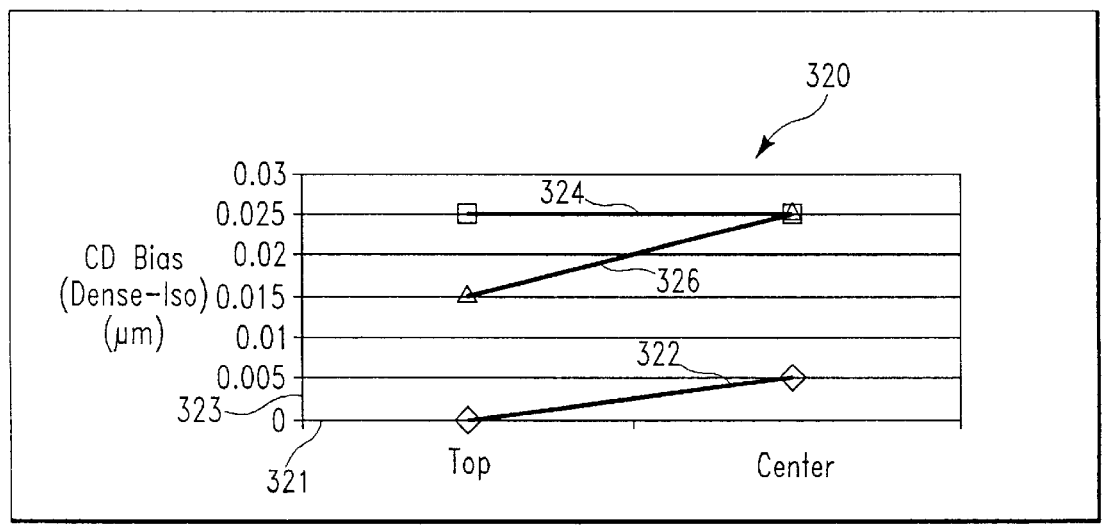
FIG. 3B shows the effect of varying the $Cl_2$ content of the plasma source gas used during the second polysilicon etch step, the second passivating step, and the notch etch step on the critical dimension (CD) bias between dense and isolated areas of the substrate.

FIGS. 3A and 3B show the effects of varying the $Cl_2$ content of the plasma source gas used during the second polysilicon etch step, the second passivating step, and the notch etch step on the notch width and CD bias between dense and isolated areas of the substrate. All other process conditions were held constant, as follows: 160 sccm HBr; 8 sccm $He/O_2$ (where $O_2$ is 30 volume % of the $He/O_2$ mixture); 1000 W plasma source power; 40 W substrate bias power; 50 mTorr process chamber pressure; and 50° C. substrate temperature. Notch etching was performed for approximately 40 seconds.

FIG. 3A is a graph 310 which shows the effect of varying the $Cl_2$ content of the plasma source gas on the notch width 313. Notch width measurements were taken at various areas on the substrate, as indicated on axis 311. Curves 312, 314, and 316 represent $Cl_2$ flow rates of 0, 10, and 20 sccm, respectively. As shown in FIG. 3A, omitting $Cl_2$ from the plasma source gas (Curve 312) appeared to slow lateral notch etching. $Cl_2$ flow rates of 10 sccm and 20 sccm (Curves 314 and 316) provided similar notch widths.

FIG. 3B is a graph 320 which shows the effect of varying the $Cl_2$ content of the plasma source gas on the CD bias 323 between dense and isolated areas of the substrate, as a function of the location on the substrate, as indicated on axis 321. Curves 322, 324, and 326 represent $Cl_2$ flow rates of 0, 10, and 20 sccm, respectively. As shown in FIG. 3B, the best dense/iso etch uniformity was seen when the $Cl_2$ flow rate was 10 sccm (Curve 324).

Figure 4A:
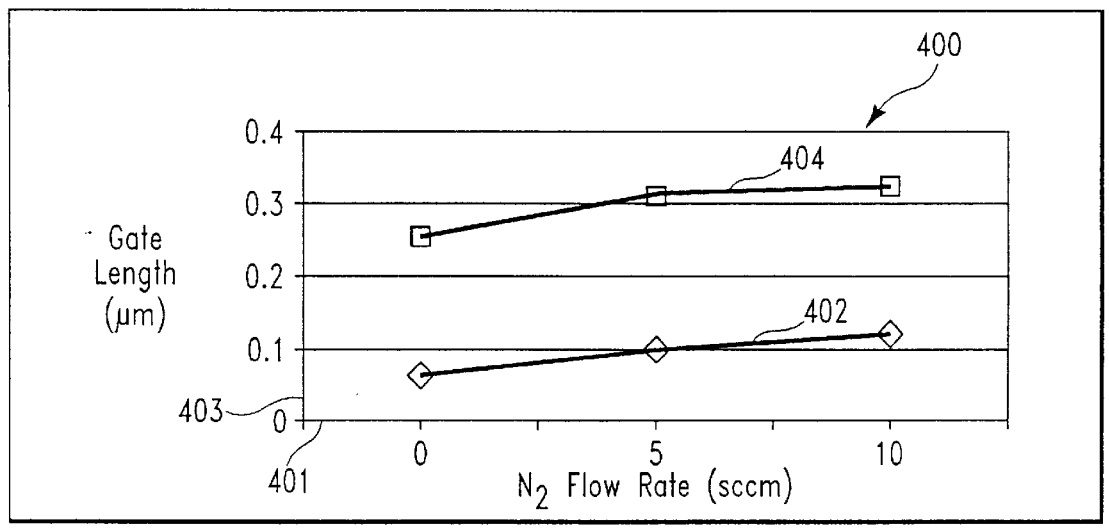
FIG. 4A shows the effect of varying the $N_2$ content of the plasma source gas used during the second passivating step on the polysilicon gate length.
Figure 4B:
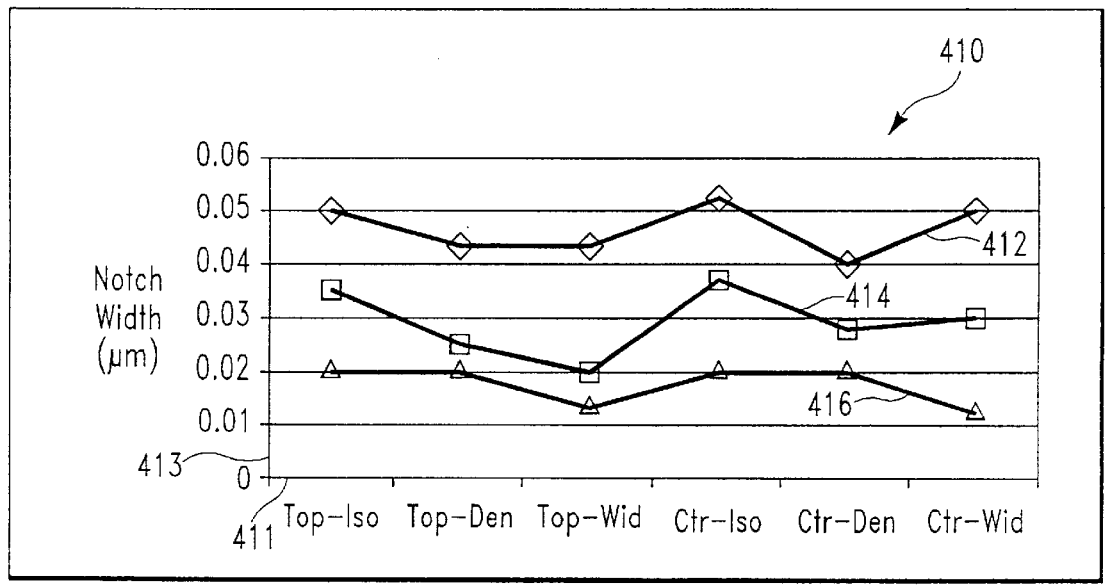
FIG. 4B shows the effect of varying the $N_2$ content of the plasma source gas used during the second passivating step on the notch width.
Figure 4C:
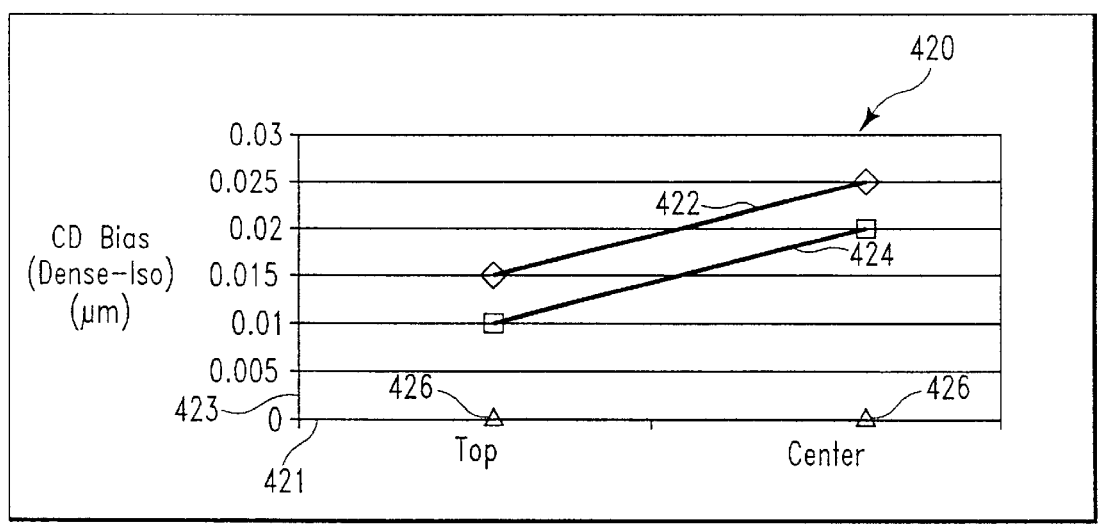
FIG. 4C shows the effect of varying the $N_2$ content of the plasma source gas used during the second passivating step on the CD bias between dense and isolated areas of the substrate.

FIGS. 4A, 4B, and 4C show the effects of varying the $N_2$ content of the plasma source gas used during the second passivating step on the polysilicon gate length, notch width, and CD bias between dense and isolated areas of the substrate. All other process conditions were held constant, as follows: 160 sccm HBr; 20 sccm $Cl_2$; 8 sccm $He/O_2$ (where $O_2$ is 30 volume % of the $He/O_2$ mixture); 1000 W plasma source power; 40 W substrate bias power; 50 mTorr process chamber pressure; and 50° C. substrate temperature. Notch etching was performed for approximately 40 seconds.

FIG. 4A is a graph 400 which shows the effect of varying the $N_2$ content 401 of the plasma source gas on the polysilicon gate length 403. Curves 402 and 404 represent gate length measurements for two different size features (target gate lengths of 0.15 μm and 0.35 μm, respectively). As shown in FIG. 4A, increasing the $N_2$ content of the plasma source gas from 0 sccm to 10 sccm resulted in an increase in the polysilicon gate length, for both feature sizes.

FIG. 4B is a graph 410 which shows the effect of varying the $N_2$ content of the plasma source gas on the notch width 413. Notch width measurements were taken at various areas on the substrate, as indicated on axis 411. Curves 412, 414, and 416 represent $N_2$ flow rates of 0, 5, and 10 sccm, respectively. As shown in FIG. 4B, increasing the $N_2$ flow rate significantly slowed lateral notch etching over the entire range of flow rates from 0 to 10 sccm.

FIG. 4C is a graph 420 which shows the effect of varying the $N_2$ content of the plasma source gas on the CD bias 423 between dense and isolated areas of the substrate, as a function of the location on the substrate, as indicated on axis 421. Curves 422, 424, and 426 represent $N_2$ flow rates of 0, 5, and 10 sccm, respectively. As shown in FIG. 4C, increasing the $N_2$ flow rate to 10 sccm (Curve 426) produced both a zero CD bias and etch uniformity at each given location across the substrate.

Figure 5A:
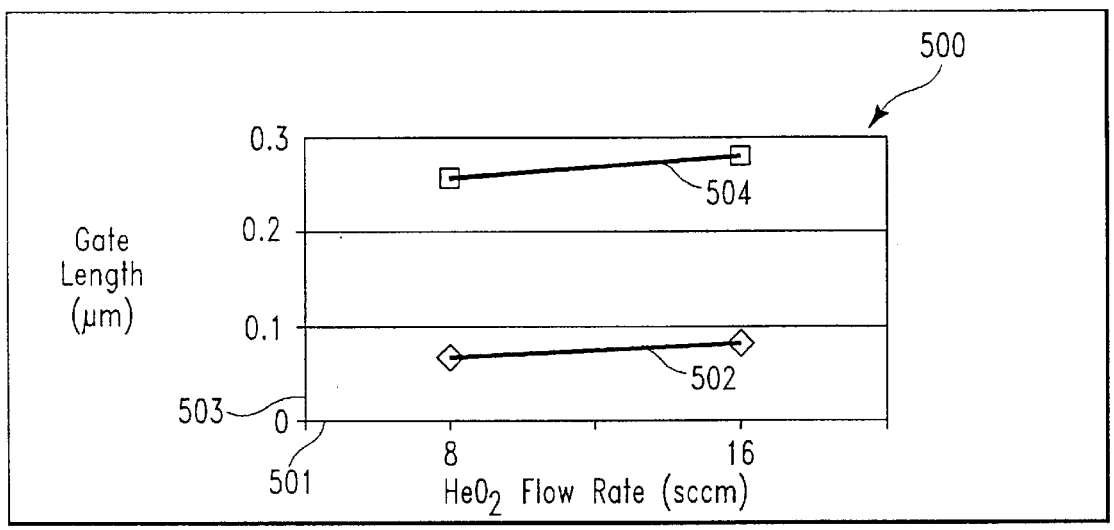
FIG. 5A shows the effect of varying the $He/O_2$ content of the plasma source gas used during the second polysilicon etch step, the second passivating step, and the notch etch step on the polysilicon gate length.
Figure 5B:
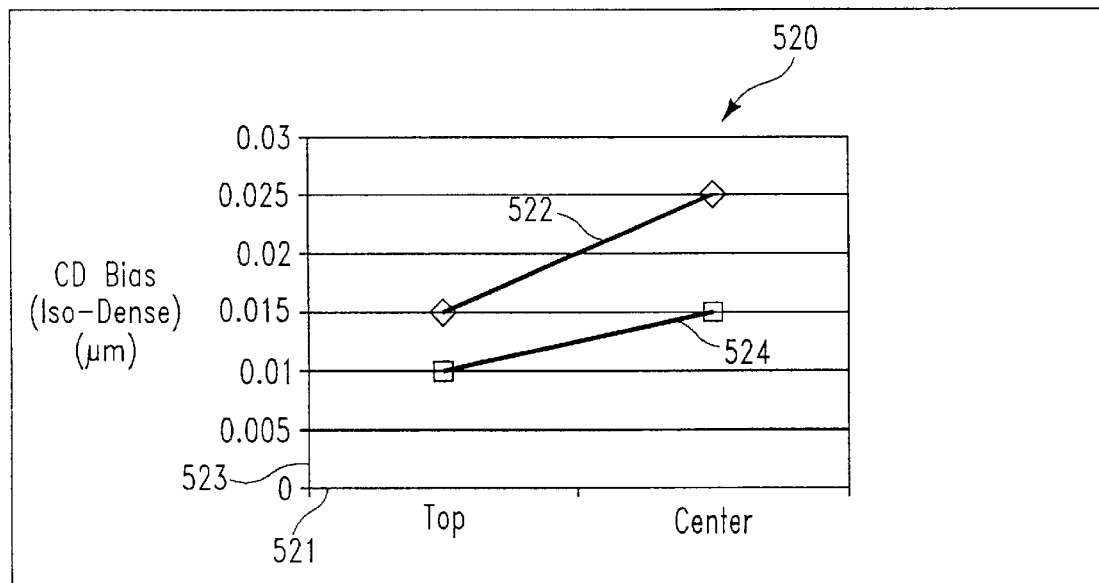
FIG. 5B shows the effect of varying the $He/O_2$ content of the plasma source gas used during the second polysilicon etch step, the second passivating step, and the notch etch step on the CD bias between dense and isolated areas of the substrate.

FIGS. 5A and 5B show the effects of varying the $He/O_2$ (where $O_2$ is 30 volume % of the $He/O_2$ mixture) content of the plasma source gas used during the second polysilicon etch step, the second passivating step, and the notch etch step on the polysilicon gate length and CD bias between dense and open areas of the substrate. All other process conditions were held constant, as follows: 160 sccm HBr; 20 sccm $Cl_2$; 1000 W plasma source power; 40 W substrate bias power; 50 mTorr process chamber pressure; and 50° C. substrate temperature. Notch etching was performed for approximately 40 seconds.

FIG. 5A is a graph 500 which shows the effect of varying the $He/O_2$ content of the plasma source gas 501 on the polysilicon gate length 503. Curves 502 and 504 represent gate length measurements for two different size features (target gate lengths of 0.15 μm and 0.35 μm, respectively). As shown in FIG. 5A, increasing the $He/O_2$ content of the plasma source gas from 8 sccm to 16 sccm produced a minor increase on the polysilicon gate length, for both feature sizes.

FIG. 5B is a graph 520 which shows the effect of varying the $He/O_2$ content of the plasma source gas on the CD bias 523 between dense and isolated areas of the substrate, as a function of the location on the substrate, as indicated on axis 521. Curves 522 and 524 represent $He/O_2$ flow rates of 8 sccm and 16 sccm, respectively. As shown in FIG. 5B, both better iso/dense etch uniformity CD bias and uniformity across the substrate were achieved at 16 sccm $He/O_2$ (Curve 524).

Figure 6A:
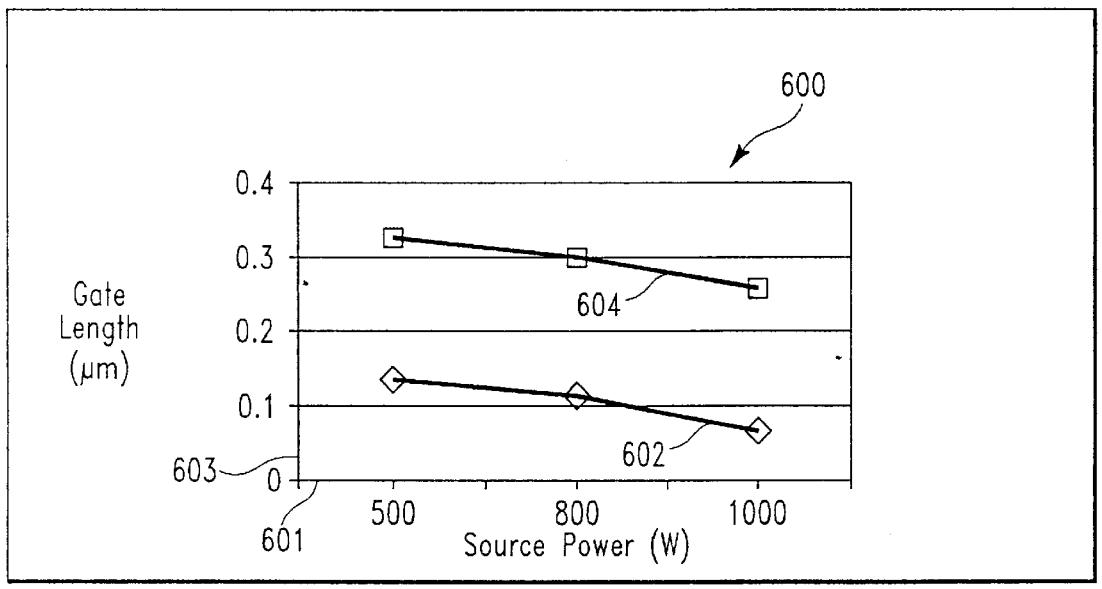
FIG. 6A shows the effect of varying the plasma source power during the second polysilicon etch step, the second passivating step, and the notch etch step on the polysilicon gate length.
Figure 6B:
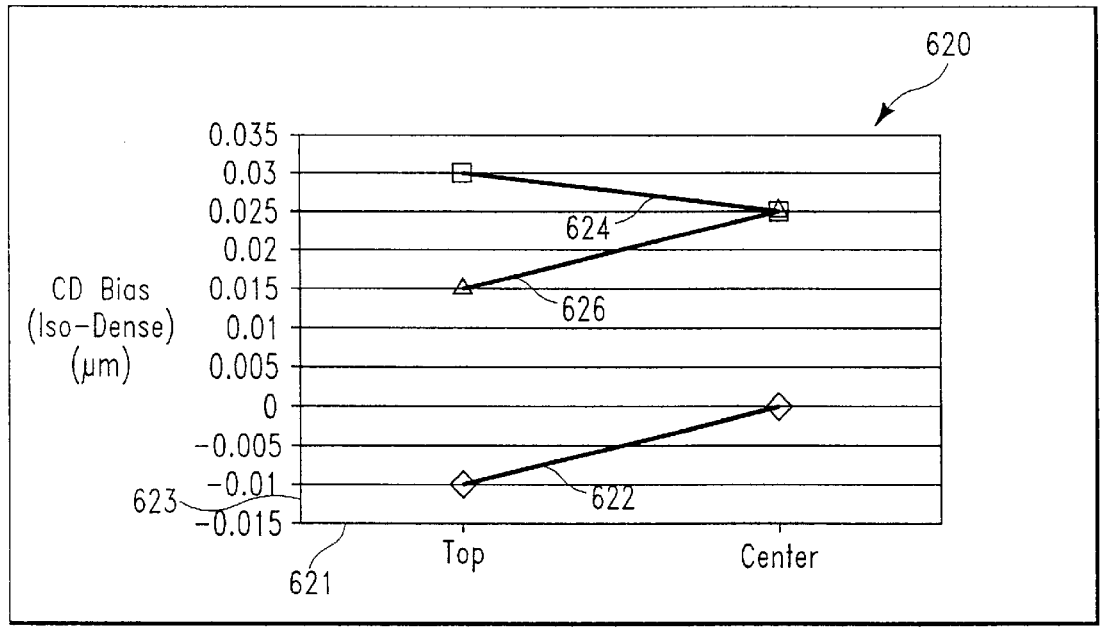
FIG. 6B shows the effect of varying the plasma source power during the second polysilicon etch step, the second passivating step, and the notch etch step on the CD bias between dense and isolated areas of the substrate.

FIGS. 6A and 6B show the effects of varying the plasma source power used during the second polysilicon etch step, the second passivating step, and the notch etch step on the polysilicon gate length and CD bias between dense and isolated areas of the substrate. All other process conditions were held constant, as follows: 160 sccm HBr; 20 sccm $Cl_2$; 8 sccm $He/O_2$ (where $O_2$ is 30 volume % of the $He/O_2$ mixture); 40 W substrate bias power; 50 mTorr process chamber pressure; and 50° C. substrate temperature. Notch etching was performed for approximately 40 seconds.

FIG. 6A is a graph 600 which shows the effect of varying the plasma source power 601 on the polysilicon gate length 603. Curves 602 and 604 represent gate length measurements for two different size features (target gate lengths of 0.15 μm and 0.35 μm, respectively). As shown in FIG. 6A, increasing the plasma source power from 500 W to 1000 W resulted in a decrease in the polysilicon gate length, for both feature sizes.

FIG. 6B is a graph 620 which shows the effect of varying the plasma source power on the CD bias 623 between dense and isolated areas of the substrate, as a function of the location on the substrate, as indicated on axis 621. Curves 622, 624, and 626 represent plasma source powers of 500 W, 800 W, and 1000 W, respectively. As shown in FIG. 6B, the best CD bias was achieved at 500 W plasma source power, while the best uniformity across the substrate was achieved at 1000 W plasma source power.

Figure 7A:
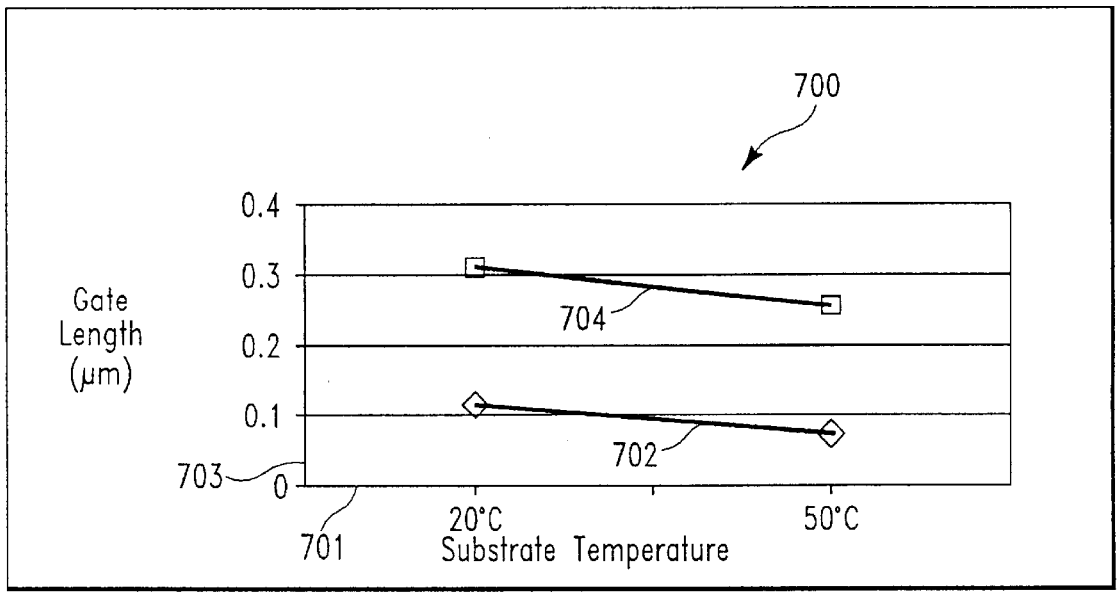
FIG. 7A shows the effect of varying the substrate temperature during the second polysilicon etch step, the second passivating step, and the notch etch step on the polysilicon gate length.
Figure 7B:
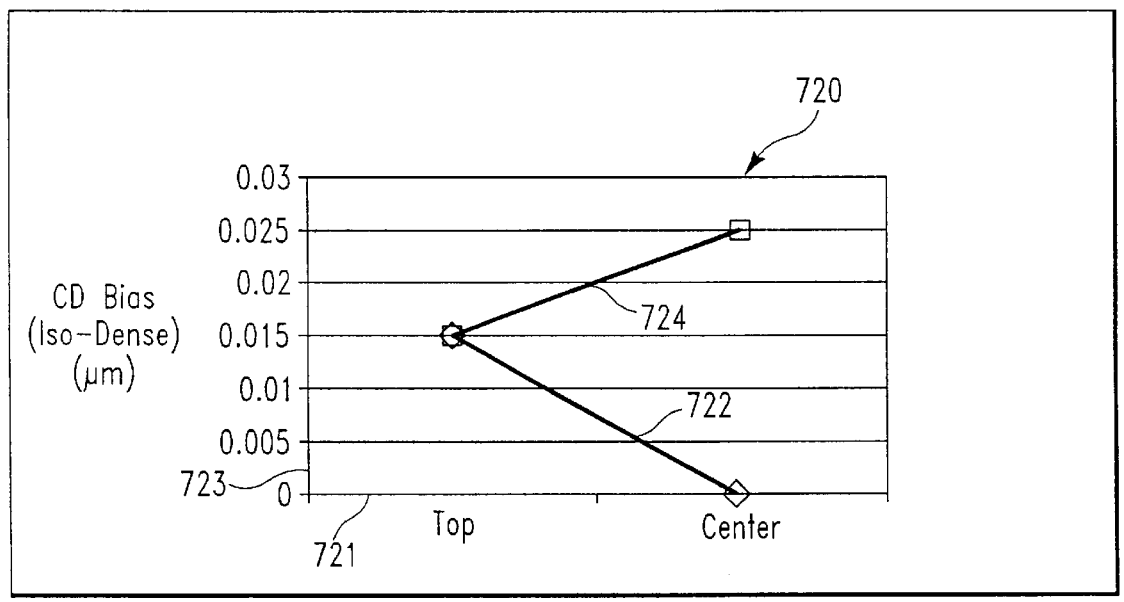
FIG. 7B shows the effect of varying the substrate temperature during the second polysilicon etch step, the second passivating step, and the notch etch step on the CD bias between dense and isolated areas of the substrate.

FIGS. 7A and 7B show the effects of varying the substrate temperature during the second polysilicon etch step, the second passivating step, and the notch etch step on the polysilicon gate length and CD bias between dense and isolated areas of the substrate. All other process conditions were held constant, as follows: 160 sccm HBr; 20 sccm $Cl_2$; 8 sccm $He/O_2$ (where $O_2$ is 30 volume % of the $He/O_2$ mixture); 1000 W plasma source power; 40 W substrate bias power; and 50 mTorr process chamber pressure. Notch etching was performed for approximately 40 seconds.

FIG. 7A is a graph 700 which shows the effect of varying the substrate temperature 701 on the polysilicon gate length 703. Curves 702 and 704 represent gate length measurements for two different size features (target gate lengths of 0.15 μm and 0.35 μm, respectively). As shown in FIG. 7A, increasing the substrate temperature from 20° C. to 50° C. resulted in a decrease in the polysilicon gate length, for both feature sizes.

FIG. 7B is a graph 720 which shows the effect of varying the substrate temperature on the CD bias 723 between dense and isolated areas of the substrate, as a function of the location on the substrate, as indicated on axis 721. Curves 722 and 724 represent substrate temperatures of 20° C. and 50° C., respectively. As shown in FIG. 7B, increasing the substrate temperature to 50° C. (Curve 724) had a negative effect of significantly increasing the CD bias, while providing slightly better uniformity across the substrate.

Figure 8:
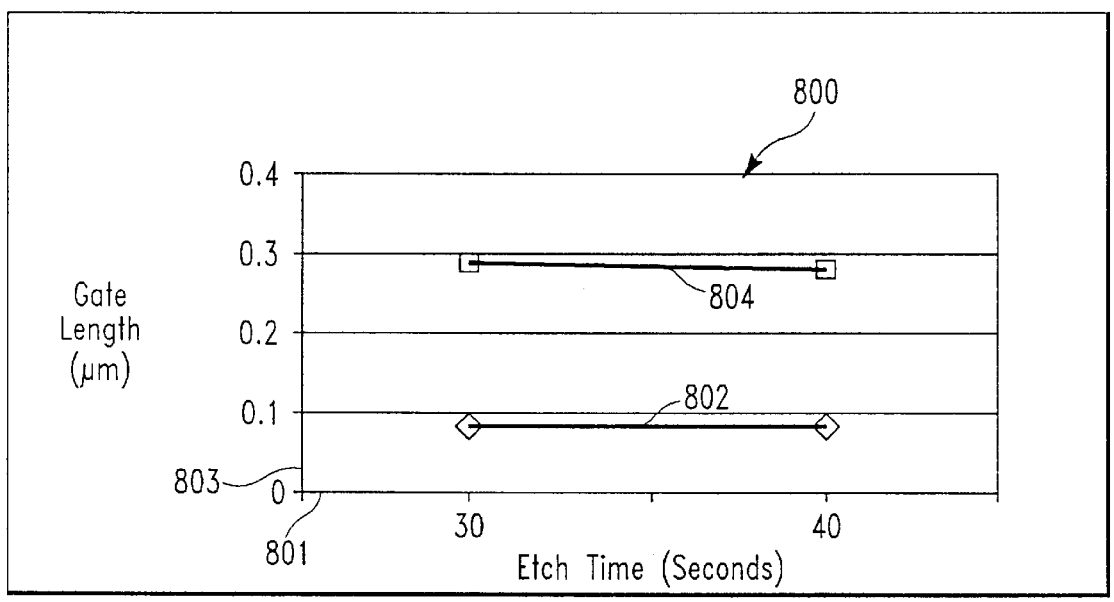
FIG. 8 shows the effect of varying the etch time during the notch etch step on the polysilicon gate length.

FIG. 8 shows the effect of varying the notch etch time during the notch etch step on the polysilicon gate length. All other process conditions were held constant, as follows: 160 sccm HBr; 20 sccm Cl$_2$; 8 sccm He/O$_2$ (where O$_2$ is 30 volume % of the He/O$_2$ mixture); 1000 W plasma source power; 40 W substrate bias power; 50 mTorr process chamber pressure; and 50° C. substrate temperature.

FIG. 8 is a graph 800 which shows the effect of varying the etch time 801 on the polysilicon gate length 803. Curves 802 and 804 represent gate length measurements for two different size features (target gate lengths of 0.15 μm and 0.35 μm, respectively). As shown in FIG. 8, increasing the etch time of the notch etch step from 30 seconds to 40 seconds had only a minor effect on the polysilicon gate length, for both feature sizes.

The above described preferred embodiments are not intended to limit the scope of the present invention, as one skilled in the art can, in view of the present disclosure expand such embodiments to correspond with the subject matter of the invention claimed below.

We claim:

1. A method of forming a notched silicon-containing gate structure, said method comprising the steps of:
   a) providing an etch stack including, from top to bottom, a patterned masking layer, a silicon-containing gate layer, a gate dielectric layer, and an underlying substrate;
   b) etching said silicon-containing gate layer to a first desired depth using a plasma generated from a first source gas, to form a first passivation layer on sidewalls of said silicon-containing gate layer which are exposed during etching, whereby upper silicon-containing gate layer sidewalls are protected from etching during subsequent etching steps;
   c) etching the remaining portion of said silicon-containing gate layer using a plasma generated from a second source gas which selectively etches said silicon-containing gate layer relative to said gate dielectric layer, to form a lower sidewall of said silicon-containing gate layer and to expose an upper surface of said gate dielectric layer;
   d) exposing said etch stack to a plasma generated from a third source gas which includes nitrogen, to form a second, nitrogen-containing passivation layer on said exposed sidewalls of said etched silicon-containing gate layer; and
   e) etching a notch in said lower sidewall of said silicon-containing gate layer which is not protected by said first passivation layer, using a plasma generated from a fourth source gas which selectively etches said silicon-containing gate layer relative to said gate dielectric layer.

2. The method of claim 1, wherein said patterned masking layer is a dielectric antireflection coating (DARC) layer.

3. The method of claim 2, wherein said DARC layer comprises silicon oxynitride.

4. The method of claim 2, wherein said DARC layer comprises an organic DARC material.

5. The method of claim 1, wherein said silicon-containing gate layer comprises a material selected from the group consisting of polysilicon and amorphous silicon.

6. The method of claim 5, wherein said silicon-containing gate layer material includes a dopant.

7. The method of claim 1, wherein said gate dielectric layer comprises an inorganic oxide.

8. The method of claim 7, wherein said inorganic oxide is selected from the group consisting of silicon oxide, silicon oxynitride, and tantalum pentoxide.

9. The method of claim 1, wherein said gate dielectric layer comprises an organic dielectric material.

10. The method of claim 9, wherein said organic dielectric material is selected from the group consisting of Poly (arylene)ethers, Polyl(arylene)ether oxazoles, Parylene-N, Polyimides, Polynaphthalene-N, Polyphenyl-Quinoxalines, Polybenzoxazoles, Polyindane, Polynorborene, Polyphenyleneoxide, αC, and combinations thereof.

11. The method of claim 1, wherein said substrate comprises a material selected from the group consisting of silicon, silicon-on-insulator (SOI), and glass.

12. The method of claim 11, wherein said substrate comprises silicon and said silicon-comprising gate layer comprises polysilicon.

13. The method of claim 11, wherein said substrate comprises glass and said silicon-containing gate layer comprises amorphous silicon.

14. The method of claim 5, wherein said gate dielectric layer comprises silicon oxide.

15. The method of claim 5, wherein said first source gas comprises at least one etchant gas selected from the group consisting of a fluorine-comprising gas, a chlorine-comprising gas, and a bromine-comprising gas, and at least one passivating gas selected from the group consisting of N$_2$, O$_2$, and HBr.

16. The method of claim 15, wherein said first source gas comprises CF$_4$, Cl$_2$, and N$_2$.

17. The method of claim 16, wherein said first source gas comprises about 50 to about 80 volume % CF$_4$, about 10 to about 40 volume % Cl$_2$, and about 10 to about 40 volume % N$_2$.

18. The method of claim 15, wherein said first source gas comprises CF$_4$, HBr, Cl$_2$, and He/O$_2$.

19. The method of claim 18, wherein said first source gas comprises about 10 to about 20 volume % CF$_4$, about 40 to about 80 volume %, HBr, about 30 to about 60 volume % Cl$_2$, and about 5 to about 10 volume % He/O$_2$.

20. The method of claim 15, wherein said first source gas comprises HBr, Cl$_2$, and He/O$_2$.

21. The method of claim 20, wherein said first source gas comprises about 40 to about 80 volume %, HBr, about 30 to about 70 volume % Cl$_2$, and about 5 to about 10 volume % He/O$_2$.

22. The method of claim 1, wherein a substrate bias power applied during step b) is at least about 60 W.

23. The method of claim 22, wherein said substrate bias power is at least about 80 W.

24. The method of claim 23, wherein a substrate bias voltage applied during step b) is at least about −100 V.

25. The method of claim 1, wherein said second source gas provides a selectivity for etching said silicon-containing gate layer relative to said gate dielectric layer of at least 20:1.

26. The method of claim 14, wherein second source gas comprises a bromine-comprising gas, a chlorine-comprising gas, and an oxygen-comprising gas.

27. The method of claim 26, wherein said second source gas comprises HBr, Cl$_2$, and He/O$_2$.

28. The method of claim 27, wherein said second source gas comprises about 70 to about 90 volume % HBr, about 5 to about 20 volume % Cl$_2$, and about 2 to about 10 volume % He/O$_2$, wherein O$_2$ comprises about 30 volume % of the He/O$_2$ mixture.

29. The method of claim 14, wherein said third source gas comprises a bromine-comprising gas, a chlorine-comprising gas, N$_2$, and an oxygen-comprising gas.

30. The method of claim 29, wherein said third source gas comprises HBr, Cl$_2$, N$_2$, and He/O$_2$.

31. The method of claim 30, wherein said third source gas comprises about 70 to about 90 volume % HBr, about 5 to about 20 volume % Cl$_2$, about 2 to about 10 volume % N$_2$, and about 2 to about 10 volume % He/O$_2$, wherein O$_2$ comprises about 30 volume % of the He/O$_2$ mixture.

32. The method of claim 1, wherein said fourth source gas provides a selectivity for etching said silicon-containing gate layer relative to said gate dielectric layer of at least 20:1.

33. The method of claim 14, wherein said fourth source gas provides a selectivity for etching said silicon-containing gate layer relative to said gate dielectric layer of at least 100:1.

34. The method of claim 14, wherein said fourth source gas comprises a bromine-comprising gas, a chlorine-comprising gas, and an oxygen-comprising gas.

35. The method of claim 34, wherein said fourth source gas comprises HBr, Cl$_2$, and He/O$_2$.

36. The method of claim 35, wherein said fourth source gas comprises about 70 to about 90 volume % HBr, about 5 to about 20 volume % Cl$_2$, and about 2 to about 10 volume % He/O$_2$, wherein O$_2$ comprises about 30 volume % of the He/O$_2$ mixture.

37. The method of claim 1, wherein said second source gas and said fourth source gas do not contain a passivating gas.

38. The method of claim 1, wherein a substrate bias power applied during steps c), d), and e) is about 80% or less of a substrate bias power applied during step b).

39. The method of claim 38, wherein said substrate bias power applied during steps c), d), and e) is within the range of about 50% to about 75% of a substrate bias power applied during step b).

40. The method of claim 23, wherein a substrate bias power applied during steps c), d), and e) is within the range of about 40 W to about 50 W.

41. The method of claim 1, wherein a height to width ratio for said notch ranges from about 1:1 to about 10:1.

42. The method of claim 1, wherein said notched silicon-containing gate structure is T-shaped.

43. A method of controlling a line width at the base of a silicon-containing gate structure, said method comprising the steps of:
   a) providing an etch stack including, from top to bottom, a patterned masking layer, a silicon-containing gate layer, a gate dielectric layer, and an underlying substrate;
   b) etching said silicon-containing gate layer to a first desired depth using a plasma generated from a first source gas, to form a first passivation layer on sidewalls of said silicon-containing gate layer which are exposed during etching, whereby upper silicon-containing gate layer sidewalls are protected from etching during subsequent etching steps;
   c) etching the remaining portion of said silicon-containing gate layer using a plasma generated from a second source gas which selectively etches said silicon-containing gate layer relative to said gate dielectric layer, to form a lower sidewall of said silicon-containing gate layer, including a gate line width at an upper surface of said gate dielectric layer;
   d) exposing said etch stack to a plasma generated from a third source gas which includes nitrogen, to form a second, nitrogen-containing passivation layer on exposed sidewalls of said silicon-containing gate layer; and
   e) etching a notch in said lower sidewall of said silicon-containing gate layer which is not protected by said first passivation layer using a plasma generated from a fourth source gas which selectively etches said silicon-containing gate layer relative to said gate dielectric layer, whereby the final line width of said silicon-containing gate structure is controlled.

44. The method of claim 43, wherein said silicon-containing gate layer comprises a material selected from the group consisting of polysilicon and amorphous silicon.

45. The method of claim 44, wherein said silicon-containing gate layer material includes a dopant.

46. The method of claim 43, wherein said gate dielectric layer comprises an inorganic oxide.

47. The method of claim 46, wherein said inorganic oxide is selected from the group consisting of silicon oxide, silicon oxynitride, and tantalum pentoxide.

48. The method of claim 43, wherein said gate dielectric layer comprises an organic dielectric material.

49. The method of claim 43, wherein said substrate comprises a material selected from the group consisting of silicon, silicon-on-insulator (SOI), and glass.

50. The method of claim 49, wherein said substrate comprises silicon and said silicon-comprising gate layer comprises polysilicon.

51. The method of claim 49, wherein said substrate comprises glass and said silicon-containing gate layer comprises amorphous silicon.

52. The method of claim 44, wherein said gate dielectric layer comprises silicon oxide.

53. The method of claim 44, wherein said first source gas comprises at least one etchant gas selected from the group consisting of a fluorine-comprising gas, a chlorine-comprising gas, and a bromine-comprising gas, and at least one passivating gas selected from the group consisting of N$_2$, O$_2$, and HBr.

54. The method of claim 53, wherein said first source gas comprises CF$_4$, Cl$_2$, and N$_2$.

55. The method of claim 53, wherein said first source gas comprises CF$_4$, HBr, Cl$_2$, and He/O$_2$.

56. The method of claim 53, wherein said first source gas comprises HBr, Cl$_2$, and He/O$_2$.

57. The method of claim 43, wherein a substrate bias voltage applied during step b) is at least about −100 V.

58. The method of claim 52, wherein second source gas comprises a bromine-comprising gas, a chlorine-comprising gas, and an oxygen-comprising gas.

59. The method of claim 58, wherein said second source gas comprises HBr, Cl$_2$, and He/O$_2$.

60. The method of claim 52, wherein said third source gas comprises a bromine-comprising gas, a chlorine-comprising gas, N$_2$, and an oxygen-comprising gas.

61. The method of claim 60, wherein said third source gas comprises HBr, Cl$_2$, N$_2$, and He/O$_2$.

62. The method of claim 52, wherein said fourth source gas comprises a bromine-comprising gas, a chlorine-comprising gas, and an oxygen-comprising gas.

63. The method of claim 62, wherein said fourth source gas comprises HBr, Cl$_2$, and He/O$_2$.

64. The method of claim 43, wherein said second source gas and said fourth source gas do not contain a passivating gas.

65. The method of claim 43, wherein a substrate bias power applied during steps c), d), and e) is about 80% or less of a substrate bias power applied during step b).

66. The method of claim 43, wherein a height to width ratio for said notch ranges from about 1:1 to about 10:1.

67. The method of claim 43, wherein said silicon-containing gate structure is T-shaped.

68. A method of forming a notched silicon-containing gate structure, said method comprising the steps of:

a) providing an etch stack including, from top to bottom, a patterned masking layer, a silicon-containing gate layer, a gate dielectric layer, and an underlying substrate;

b) etching said silicon-containing gate layer to a first desired depth using a plasma generated from a first source gas which comprises at least one etchant gas selected from the group consisting of a fluorine-comprising gas, a chlorine-comprising gas, and a bromine-comprising gas, and at least one passivating gas selected from the group consisting of $N_2$, $O_2$, and HBr;

c) etching the remaining portion of said silicon-containing gate layer using a plasma generated from a second source gas which comprises a bromine-comprising gas, a chlorine-comprising gas, and an oxygen-comprising gas, to form a lower sidewall of said silicon-containing gate layer and to expose an upper surface of the gate dielectric layer;

d) exposing said etch stack to a plasma generated from a third source gas which comprises a bromine-comprising gas, a chlorine-comprising gas, $N_2$, and an oxygen-comprising gas; and e) etching a notch in said lower sidewall of said silicon-containing gate layer, wherein etching is performed using a plasma generated from a fourth source gas which comprises a bromine-comprising gas, a chlorine-comprising gas, and an oxygen-comprising gas.

69. The method of claim 68, wherein said silicon-containing gate layer comprises a material selected from the group consisting of polysilicon and amorphous silicon.

70. The method of claim 69, wherein said silicon-containing gate layer material includes a dopant.

71. The method of claim 68, wherein said gate dielectric layer comprises an inorganic oxide.

72. The method of claim 71, wherein said inorganic oxide is selected from the group consisting of silicon oxide, silicon oxynitride, and tantalum pentoxide.

73. The method of claim 68, wherein said gate dielectric layer comprises an organic dielectric material.

74. The method of claim 68, wherein said substrate comprises a material selected from the group consisting of silicon, silicon-on-insulator (SOI), and glass.

75. The method of claim 74, wherein said substrate comprises silicon and said silicon-comprising gate layer comprises polysilicon.

76. The method of claim 74, wherein said substrate comprises glass and said silicon-containing gate layer comprises amorphous silicon.

77. The method of claim 69, wherein said gate dielectric layer comprises silicon oxide.

78. The method of claim 68, wherein said first source gas comprises $CF_4$, $Cl_2$, and $N_2$.

79. The method of claim 68, wherein said first source gas comprises $CF_4$, HBr, $Cl_2$, and $He/O_2$.

80. The method of claim 68, wherein said first source gas comprises HBr, $Cl_2$, and $He/O_2$.

81. The method of claim 68, wherein a substrate bias voltage applied during step b) is at least about −100 V.

82. The method of claim 68, wherein said second source gas comprises HBr, $Cl_2$, and $He/O_2$.

83. The method of claim 68, wherein said third source gas comprises HBr, $Cl_2$, $N_2$, and $He/O_2$.

84. The method of claim 68, wherein said fourth source gas comprises HBr, $Cl_2$, and $He/O_2$.

85. The method of claim 68, wherein said second source gas and said fourth source gas do not contain a passivating gas.

86. The method of claim 68, wherein a substrate bias power applied during steps c), d), and e) is about 80% or less of a substrate bias power applied during step b).

87. The method of claim 68, wherein a height to width ratio for said notch ranges from about 1:1 to about 10:1.

88. The method of claim 68, wherein said silicon-containing gate structure is T-shaped.

* * * * *